US012799391B2

(12) United States Patent
Shin et al.

(10) Patent No.: US 12,799,391 B2
(45) **Date of Patent: *Nov. 17, 2026**

(54) POLYCYCLIC AROMATIC DERIVATIVE COMPOUND AND ORGANOELECTROLUMINESCENT DEVICE USING SAME

(71) Applicant: SFC CO., LTD., Chungcheongbuk-do (KR)

(72) Inventors: Bong-ki Shin, Chungcheongbuk-do (KR); Sung-hoon Joo, Chungcheongbuk-do (KR); Byung-sun Yang, Chungcheongbuk-do (KR); Ji-hwan Kim, Chungcheongbuk-do (KR); Hyeon-jun Jo, Chungcheongbuk-do (KR); Sung-eun Choi, Chungcheongbuk-do (KR)

(73) Assignee: SFC CO., LTD., Chungcheongbuk-do (KR)

( * ) Notice: Subject to any disclaimer, the term of this patent is extended or adjusted under 35 U.S.C. 154(b) by 925 days.

This patent is subject to a terminal disclaimer.

(21) Appl. No.: 18/025,045

(22) PCT Filed: Sep. 8, 2021

(86) PCT No.: PCT/KR2021/012228

§ 371 (c)(1),
(2) Date: Mar. 7, 2023

(87) PCT Pub. No.: WO2022/060000

PCT Pub. Date: Mar. 24, 2022

(65) Prior Publication Data

US 2023/0329109 A1 Oct. 12, 2023

(30) Foreign Application Priority Data

Sep. 15, 2020 (KR) ........................ 10-2020-0118180

(51) Int. Cl.
*C09K 11/06* (2006.01)
*C07F 5/02* (2006.01)
*H10K 50/12* (2023.01)
*H10K 85/60* (2023.01)

(52) U.S. Cl.
CPC .............. *C09K 11/06* (2013.01); *C07F 5/027* (2013.01); *H10K 85/658* (2023.02); *C09K 2211/1018* (2013.01); *H10K 50/12* (2023.02)

(58) Field of Classification Search
None
See application file for complete search history.

(56) References Cited

U.S. PATENT DOCUMENTS

| | | | | |
|---|---|---|---|---|
| 11,985,891 B2 * | 5/2024 | Joo | ...................... | H10K 85/636 |
| 2020/0098991 A1 | 3/2020 | Kim et al. | | |
| 2020/0227639 A1 * | 7/2020 | Yamatani | .............. | H01L 51/008 |
| 2023/0413669 A1 * | 12/2023 | Moon | .................. | H10K 85/658 |

FOREIGN PATENT DOCUMENTS

| | | | |
|---|---|---|---|
| CN | 101687837 | A | 3/2010 |
| CN | 104418794 | A | 3/2015 |
| CN | 110790782 | A | 2/2020 |
| EP | 3660024 | A1 | 6/2020 |
| EP | 4238976 | A1 | 9/2023 |
| JP | 2020-083896 | A | 6/2020 |
| KR | 10-2019-0101900 | A | 9/2019 |
| KR | 10-2019-0140421 | A | 12/2019 |
| KR | 10-2094830 | B1 | 3/2020 |
| KR | 10-2020-0034899 | A | 4/2020 |
| KR | 10-2021-0043468 | A | 4/2021 |

OTHER PUBLICATIONS

Office Action from corresponding Japanese Application No. 2023-515298, dated May 13, 2024.
European Search Report from corresponding European Application No. 21869622.7, dated May 8, 2024.
International Search Report from corresponding PCT Application No. PCT/KR2021/012228, dated Jan. 10, 2022.

* cited by examiner

*Primary Examiner* — Seokmin Jeon
(74) *Attorney, Agent, or Firm* — Harness, Dickey & Pierce, P.L.C.

(57) ABSTRACT

The present invention relates to a polycyclic aromatic derivative compound and an organoelectroluminescent device comprising same. The present invention can implement a high-efficiency and long-lifetime organoelectroluminescent device with significantly improved luminous efficiency, and thus can be effectively used for industrial applications including flat display devices, flexible display devices, monochromatic or white flat lighting devices, and monochromatic or white flexible lighting devices.

10 Claims, No Drawings

POLYCYCLIC AROMATIC DERIVATIVE COMPOUND AND ORGANOELECTROLUMINESCENT DEVICE USING SAME

CROSS-REFERENCE TO RELATED APPLICATIONS

This application is a national phase application of PCT Application No. PCT/KR2021/012228, filed on Sep. 8, 2021, which claims priority to Korean Patent Application No. 10-2020-0118180, filed on Sep. 15, 2020. The entire disclosure of the applications identified in this paragraph is incorporated herein by reference.

TECHNICAL FIELD

The present invention relates to a polycyclic aromatic derivative and a highly efficient and long-lasting organic electroluminescent device with significantly improved luminous efficiency using the polycyclic aromatic derivative.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DETAILED DESCRIPTION OF THE INVENTION

Problems to be Solved by the Invention

Accordingly, the present invention is intended to provide a polycyclic aromatic derivative that is employed in an organic layer of an organic electroluminescent device to achieve high efficiency and long lifetime of the device. The present invention is also intended to provide an organic electroluminescent device including the polycyclic aromatic derivative.

Means for Solving the Problems

One aspect of the present invention provides a polycyclic aromatic derivative represented by Formula A:

[Formula A]

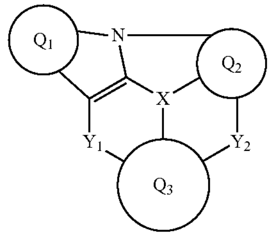

The structure of Formula A, specific compounds that can be represented by Formula A, and definitions of the rings $Q_1$ to $Q_3$, X, $Y_1$, and $Y_2$ are described below.

The present invention also provides an organic electroluminescent device including a first electrode, a second electrode opposite to the first electrode, and one or more organic layers interposed between the first and second electrodes wherein one of the organic layers includes at least one of the specific polycyclic aromatic compounds that can be represented by Formula A.

Effects of the Invention

The polycyclic aromatic derivative of the present invention can be employed in an organic layer of an organic electroluminescent device to achieve high efficiency and long lifetime of the device.

BEST MODE FOR CARRYING OUT THE INVENTION

The present invention will now be described in more detail.

The present invention is directed to a polycyclic aromatic derivative for use in an organic electroluminescent device, represented by Formula A:

[Formula A]

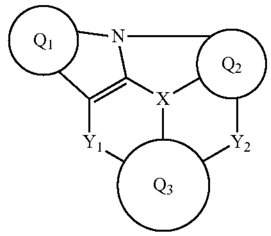

wherein $Q_1$ is selected from substituted or unsubstituted $C_6$-$C_{50}$ monocyclic or polycyclic aromatic hydrocarbon rings, substituted or unsubstituted $C_2$-$C_{50}$ monocyclic or polycyclic aromatic heterocyclic rings, substituted or unsubstituted $C_6$-$C_{50}$ monocyclic or polycyclic aliphatic hydrocarbon rings, and substituted or unsubstituted $C_2$-$C_{50}$ monocyclic or polycyclic aliphatic heterocyclic rings, $Q_2$ and $Q_3$ are the same as or different from each other and are each independently selected from substituted or unsubstituted $C_6$-$C_{50}$ monocyclic or polycyclic aromatic hydrocarbon rings and substituted or unsubstituted $C_2$-$C_{50}$ monocyclic or polycyclic aromatic heterocyclic rings, X is selected from B, P, P═O, P═S, and Al, $Y_1$ and $Y_2$ are the same as or different from each other and are each independently a single bond or selected from

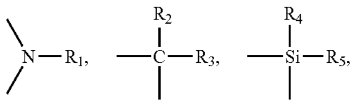

—O—, —S—, and —Se—, and $R_1$ to $R_5$ are the same as or different from each other and are each independently selected from hydrogen, deuterium, substituted or unsubstituted $C_1$-$C_{30}$ alkyl, substituted or unsubstituted $C_1$-$C_{30}$ alkenyl, substituted or unsubstituted $C_6$-$C_{50}$ aryl, substituted or unsubstituted $C_3$-$C_{30}$ cycloalkyl, substituted or unsubstituted $C_2$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, with the proviso that each of $R_1$ to $R_5$ is optionally bonded to at least one of the rings $Q_1$ to $Q_3$ to form an alicyclic or aromatic monocyclic or polycyclic ring, $R_2$ and $R_3$ are optionally linked to each other to form an alicyclic or aromatic monocyclic or polycyclic ring, and $R_4$ and $R_5$ are optionally linked to each other to form an alicyclic or aromatic monocyclic or polycyclic ring.

The use of the polycyclic aromatic derivative makes the organic electroluminescent device highly efficient and long lasting.

Specific structures of Formula A and modified structures of Formula A including additional rings within the definitions of the substituents can be found in the specific compounds that are exemplified below.

As used herein, the term "substituted" in the definition of the rings $Q_1$ to $Q_3$ and $R_1$ to $R_5$ indicates substitution with one or more substituents selected from deuterium, cyano, halogen, hydroxyl, nitro, alkyl, haloalkyl, cycloalkyl, alkenyl, alkynyl, heteroalkyl, aryl, arylalkyl, alkylaryl, heteroaryl, heteroarylalkyl, alkoxy, amine, silyl, aryloxy, and mixed aliphatic-aromatic cyclic groups, or a combination thereof. As used herein, the term "unsubstituted" in the same definition indicates having no substituent.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The alkyl groups may be straight or branched and specific examples thereof include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, adamantyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aromatic hydrocarbon rings or aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The aromatic heterocyclic rings or heteroaryl groups refer to aromatic rings interrupted by one or more heteroatoms. Examples of the aromatic heterocyclic rings or heteroaryl groups include, but are not limited to, thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The aliphatic hydrocarbon rings refer to non-aromatic rings consisting only of carbon and hydrogen atoms. The aliphatic hydrocarbon ring is intended to include monocyclic and polycyclic ones and may be optionally substituted with one or more other substituents. As used herein, the term "polycyclic" means that the aliphatic hydrocarbon ring may be directly attached or fused to one or more other cyclic groups. The other cyclic groups may be aliphatic hydrocarbon rings and other examples thereof include aliphatic heterocyclic, aryl, and heteroaryl groups. Specific examples of the aliphatic hydrocarbon rings include, but are not limited to, cycloalkyl groups such as cyclopropyl, cyclobutyl, cyclopentyl, adamantyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, and cyclooctyl, cycloalkanes such as cyclohexane and cyclopentane, and cycloalkenes such as cyclohexene and cyclopentene.

The aliphatic heterocyclic rings refer to aliphatic rings interrupted by one or more heteroatoms such as O, S, Se, N, and Si. The aliphatic heterocyclic ring is intended to include monocyclic or polycyclic ones and may be optionally substituted with one or more other substituents. As used herein, the term "polycyclic" means that the aliphatic heterocyclic ring such as heterocycloalkyl, heterocycloalkane or heterocycloalkene may be directly attached or fused to one or more other cyclic groups. The other cyclic groups may be aliphatic heterocyclic rings and other examples thereof include aliphatic hydrocarbon rings, aryl groups, and heteroaryl groups.

The mixed aliphatic-aromatic ring refers to a ring in which at least one aliphatic ring and at least one aromatic ring are linked or fused together and which is overall non-aromatic. The mixed aliphatic-aromatic polycyclic ring may contain one or more heteroatoms selected from N, O, P, and S other than carbon atoms (C).

The alkoxy group may be specifically a methoxy, ethoxy, propoxy, isobutyloxy, sec-butyloxy, pentyloxy, iso-amyloxy or hexyloxy group but is not limited thereto.

The silyl groups may be, for example, —$SiH_3$, alkylsilyl, arylsilyl, alkylarylsilyl, and arylheteroarylsilyl. Specific examples of the silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, arylamine groups, and arylheteroarylamine groups. The arylamine groups refer to aryl-substituted amine groups, the alkylamine groups refer to alkyl-substituted amine groups, and the arylheteroarylamine groups refer to aryl- and heteroaryl-substituted amine groups. Examples of the arylamine groups include substituted or unsubstituted monoarylamine groups, substituted or unsubstituted diarylamine groups, and substituted or unsubstituted triarylamine groups. The aryl and heteroaryl moieties in the arylamine and arylheteroarylamine groups may be monocyclic or polycyclic ones. The arylamine groups may include two or more aryl moieties and the arylheteroarylamine groups may include two or more heteroaryl moieties. In this case, the aryl moieties may be monocyclic or polycyclic aryl moieties or may consist of both monocyclic and polycyclic aryl moieties. The heteroaryl moieties may be monocyclic or polycyclic heteroaryl moieties or may consist of both monocyclic and polycyclic heteroaryl moieties. The aryl and heteroaryl moieties in the arylamine and arylheteroarylamine groups may be selected from those exemplified above.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic derivative represented by Formula A according to the present invention may be selected from, but not limited to, the following compounds 1 to 72:

1

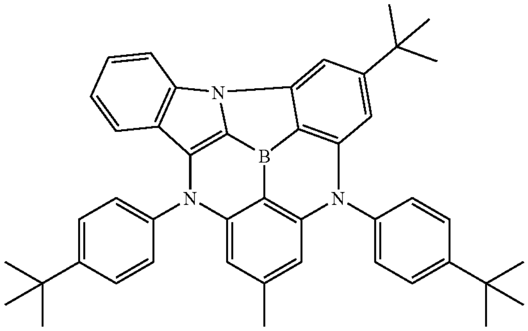

2

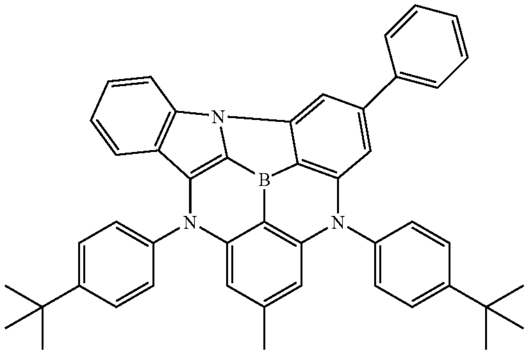

3

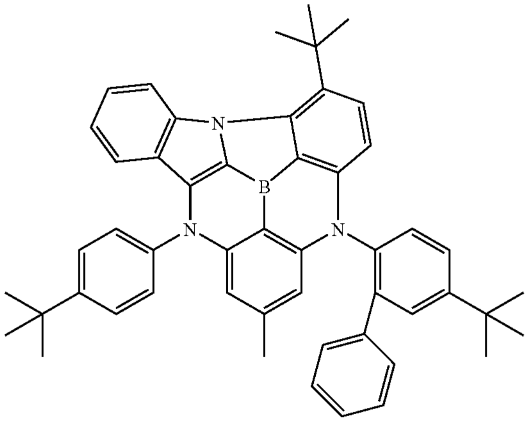

-continued
4
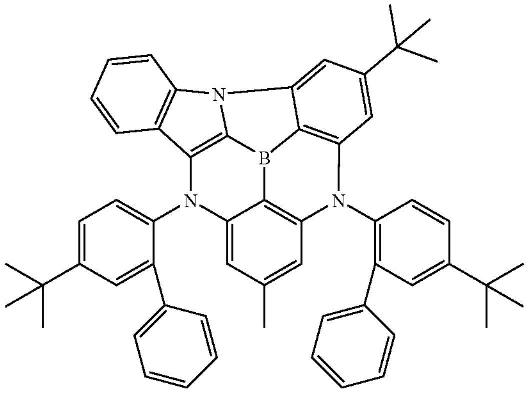
5
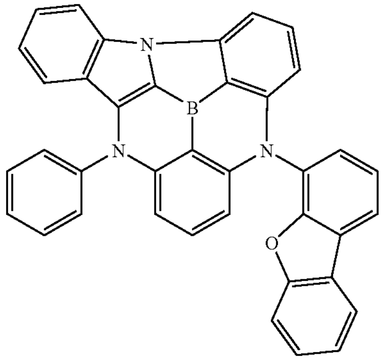
6
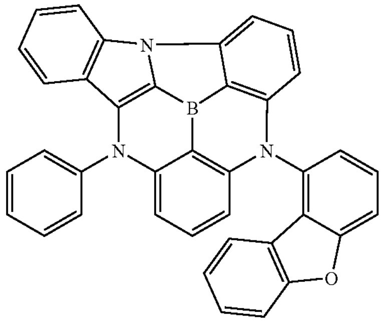
7
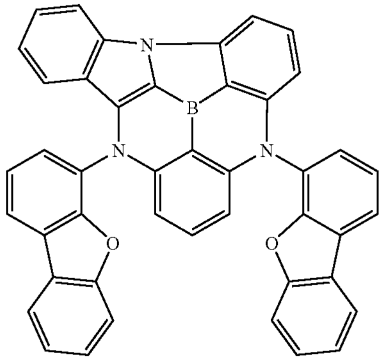
-continued
8
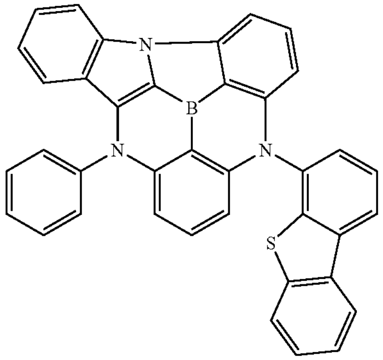
9
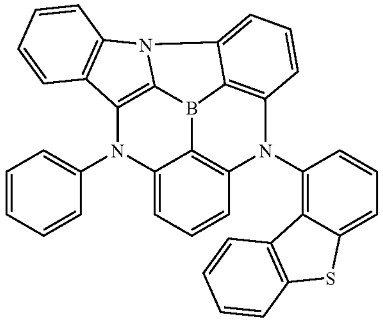
10
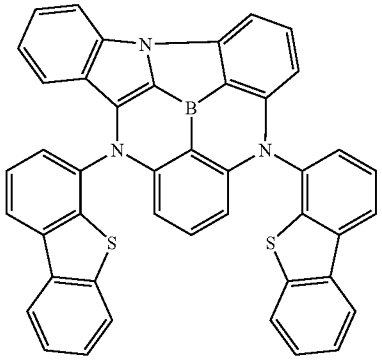
11
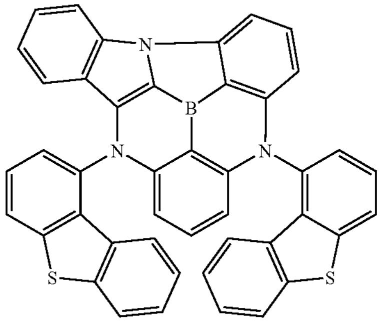

-continued
12
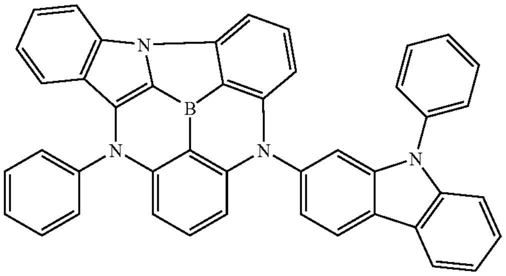
13
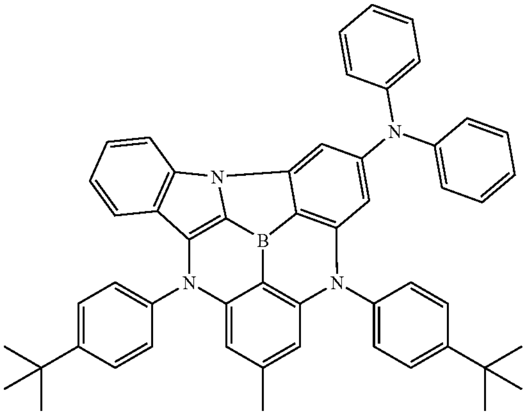
14
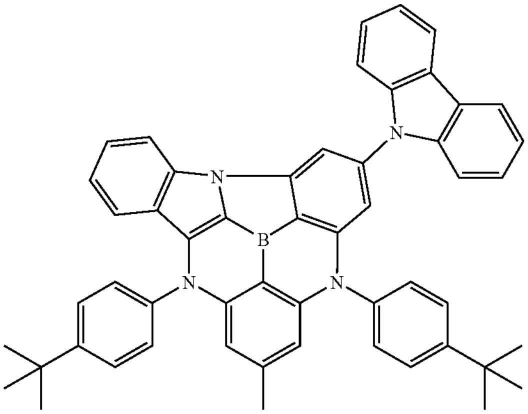
15
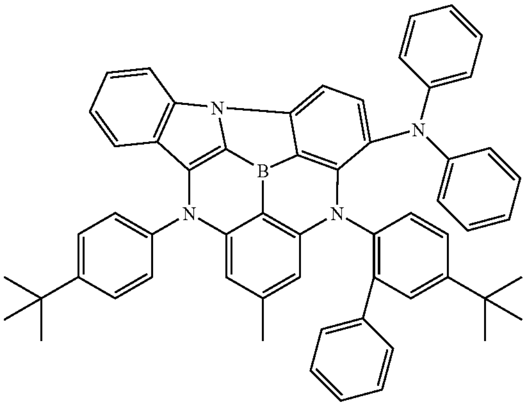
-continued
16
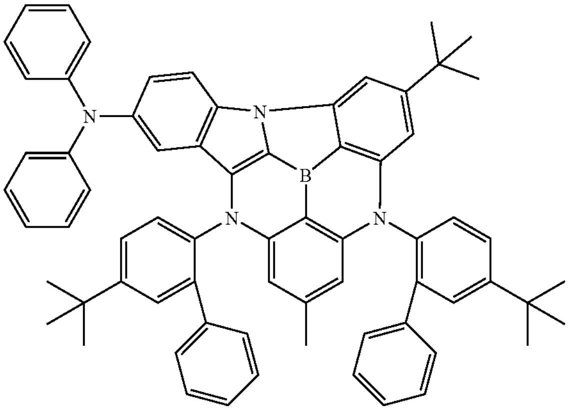
17
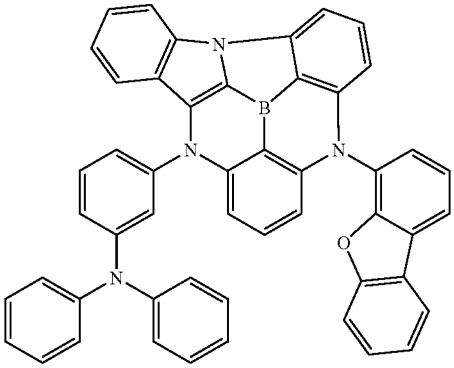
18
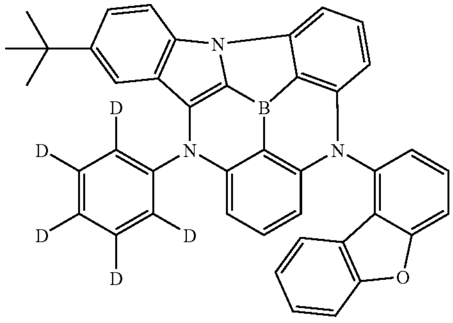
19
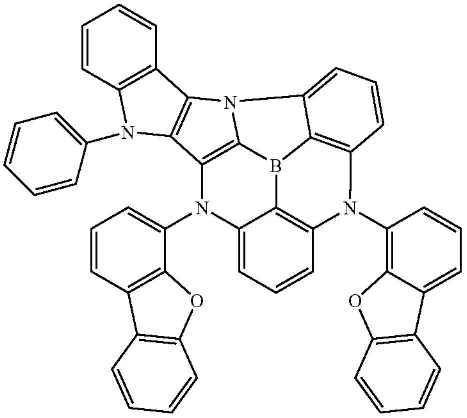

-continued
20
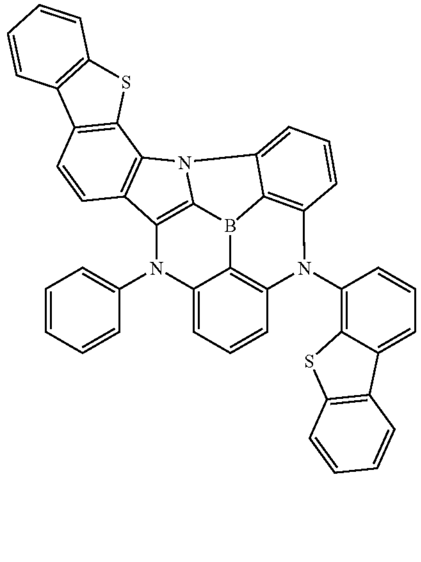
21
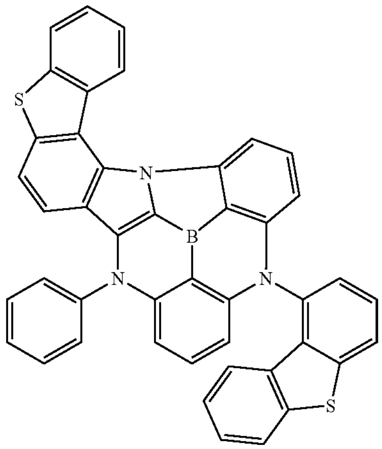
22
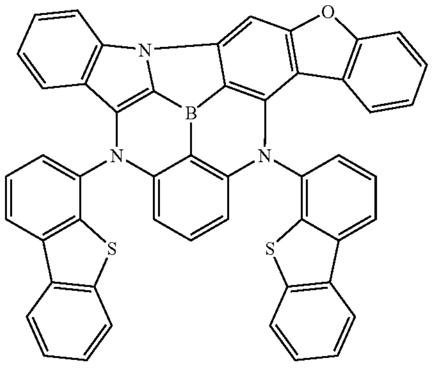
-continued
23
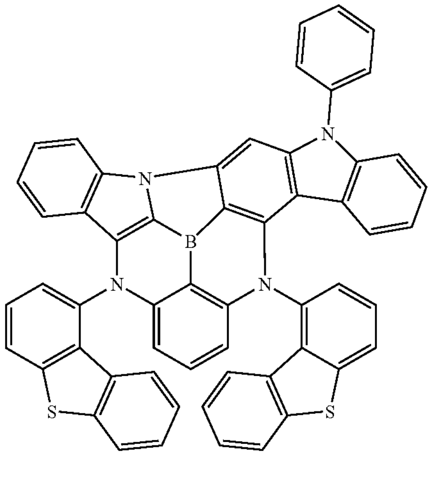
24
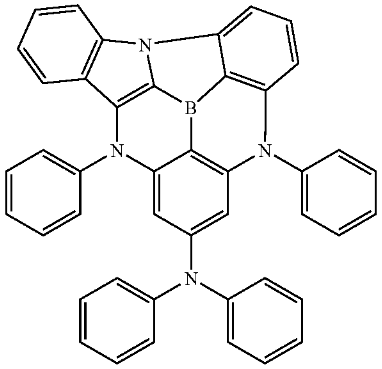
25
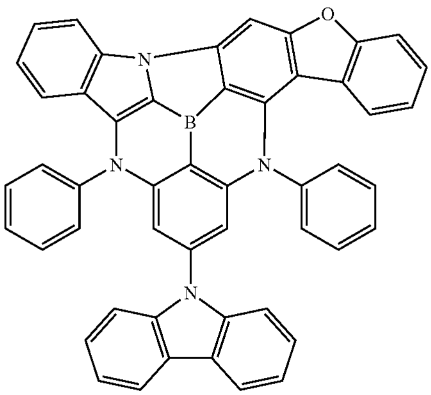

-continued
26
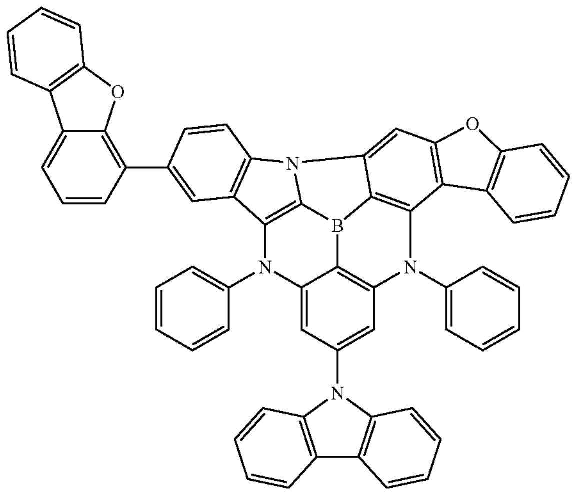
27
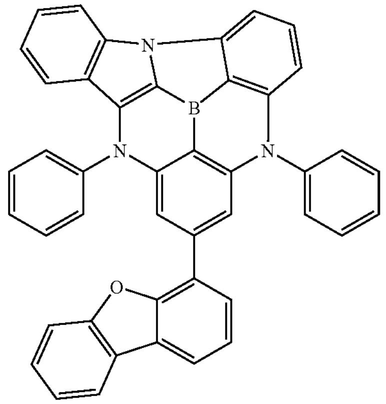
28
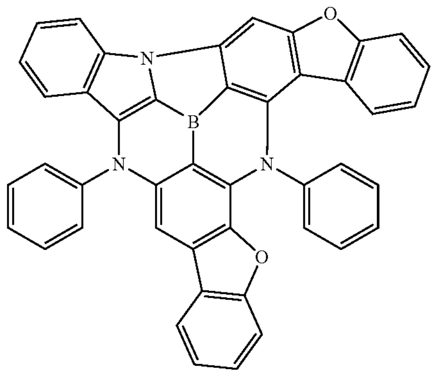
29
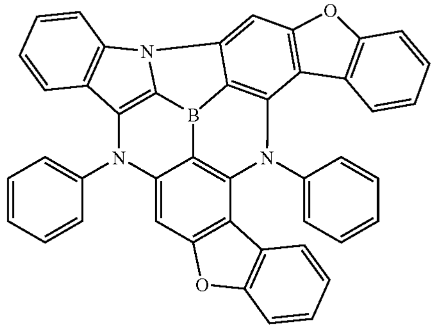
-continued
30
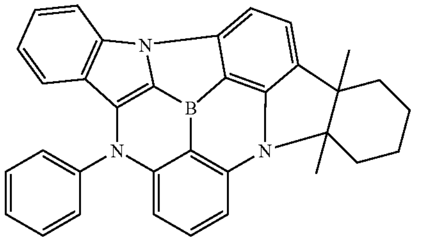
31
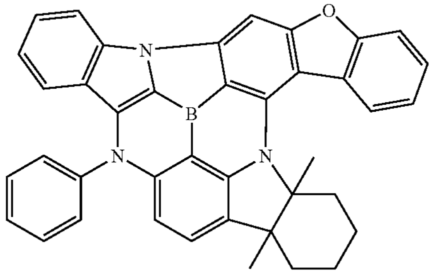
32
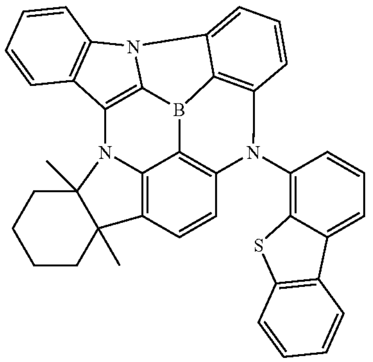
33
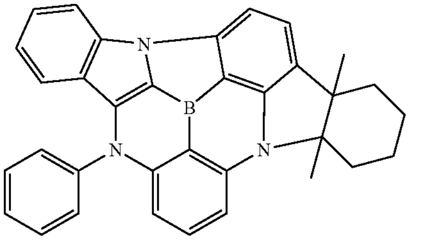
34
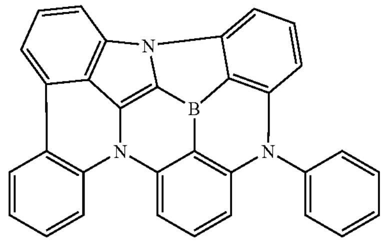

-continued
35
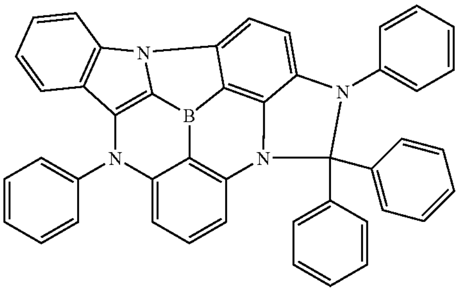
36
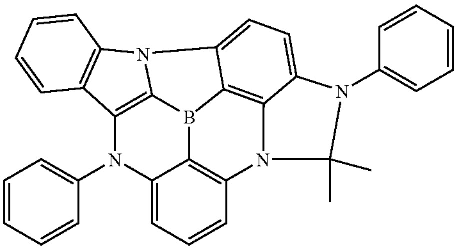
37
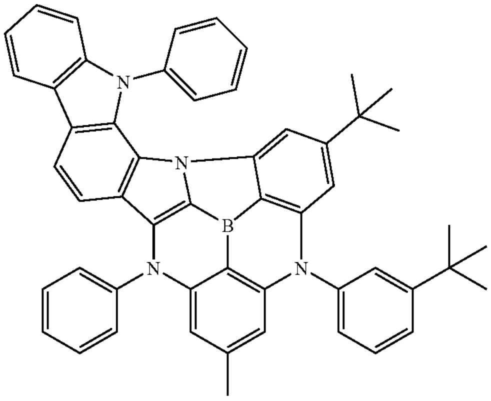
38
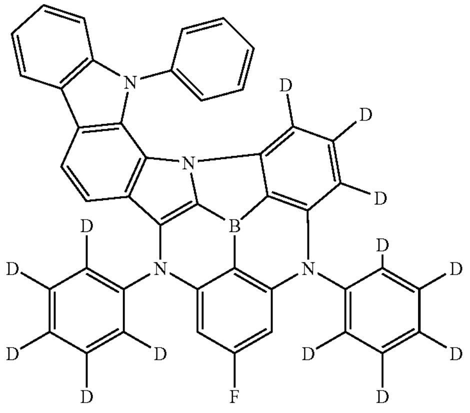
-continued
39
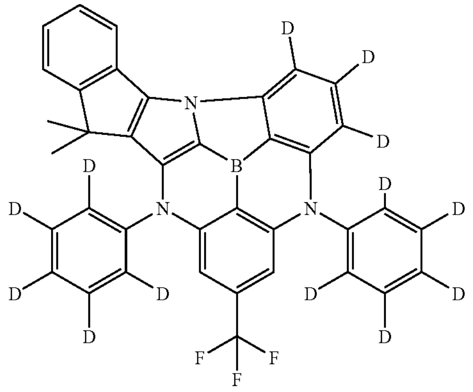
40
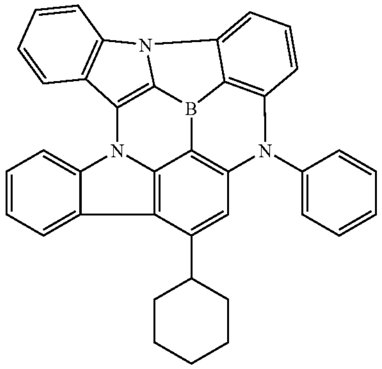
41
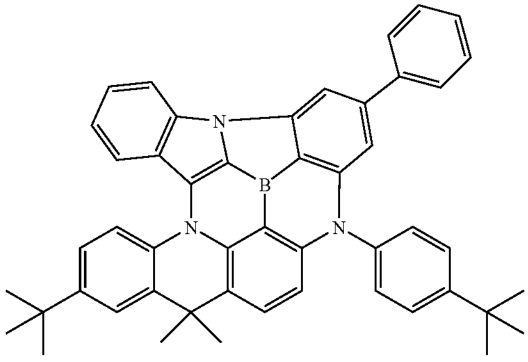
42
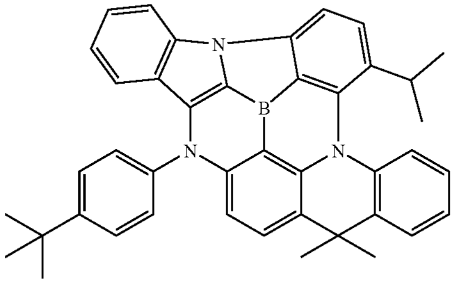

-continued
43
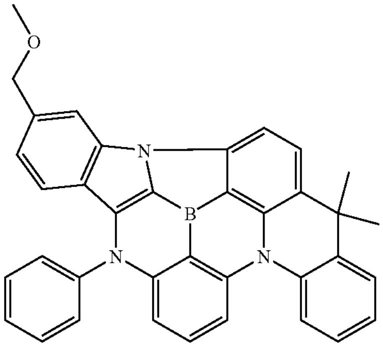
44
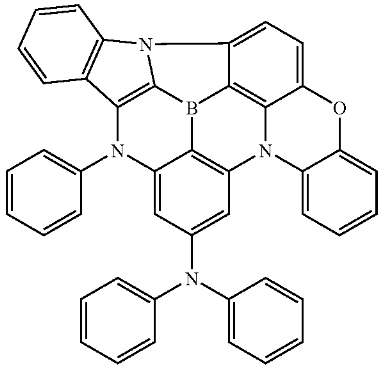
45
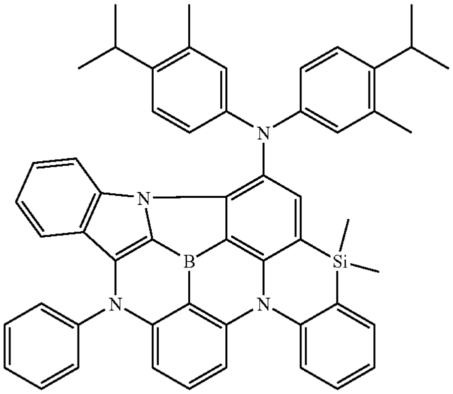
46
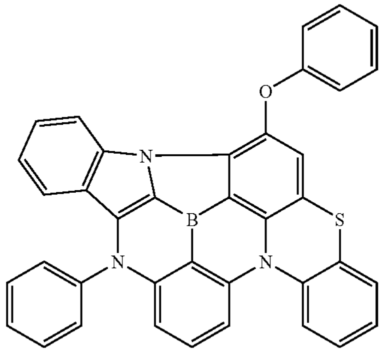
-continued
47
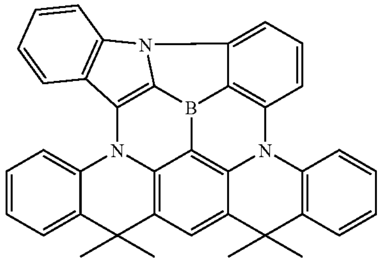
48
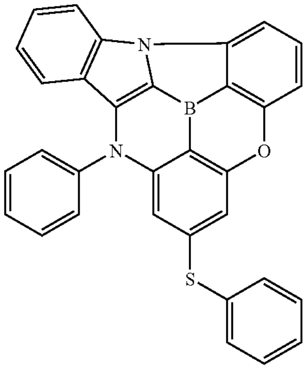
49
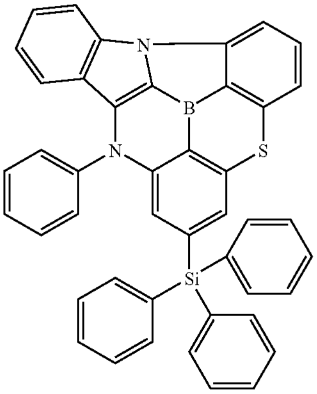
50
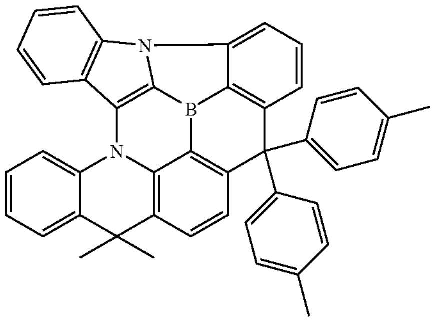
51
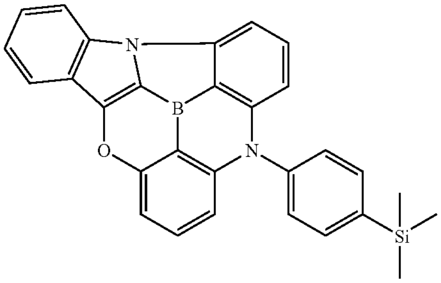

-continued
52
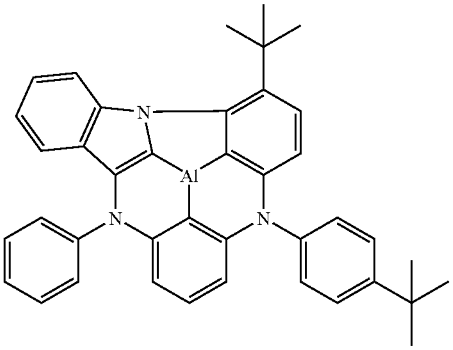
53
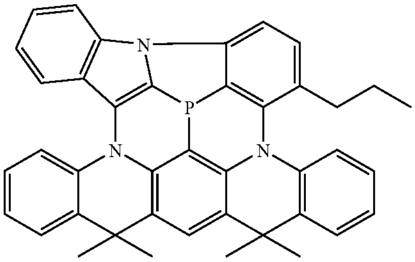
54
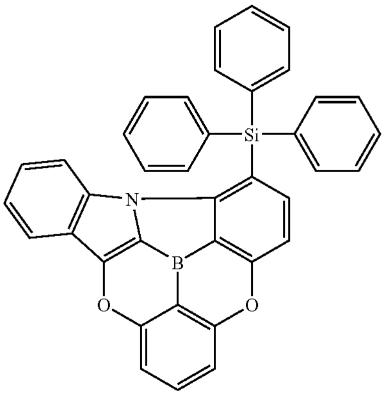
55
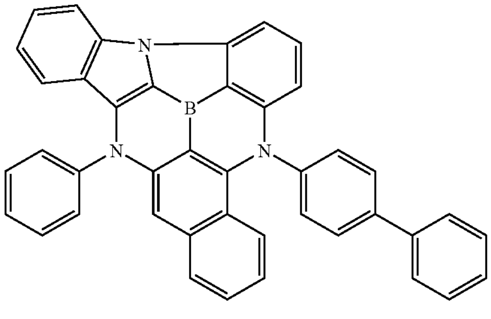
-continued
56
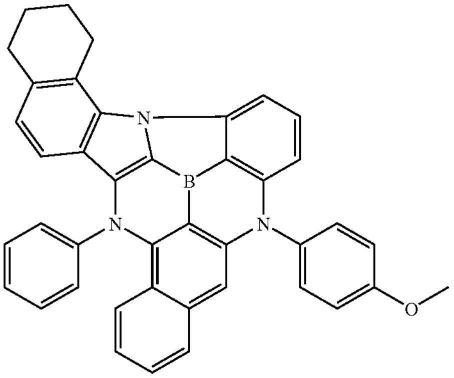
57
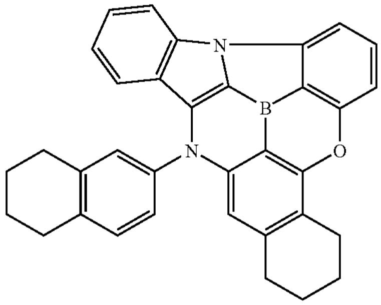
58
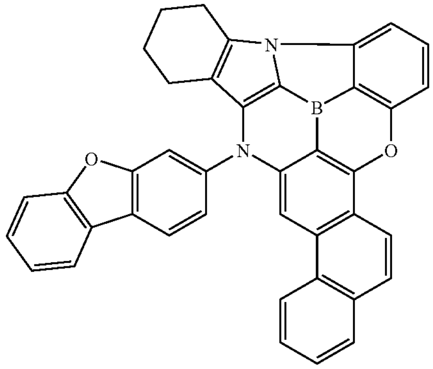
59
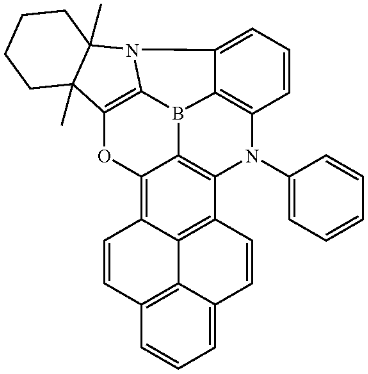

-continued
60
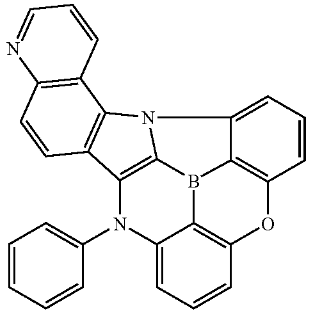
61
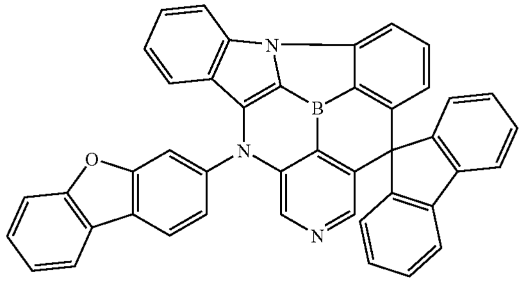
62
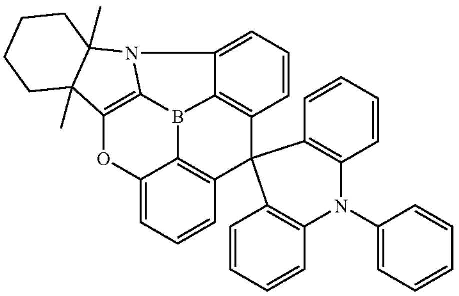
63
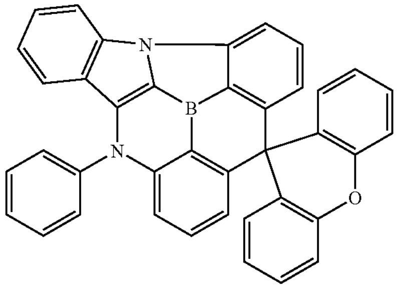
64
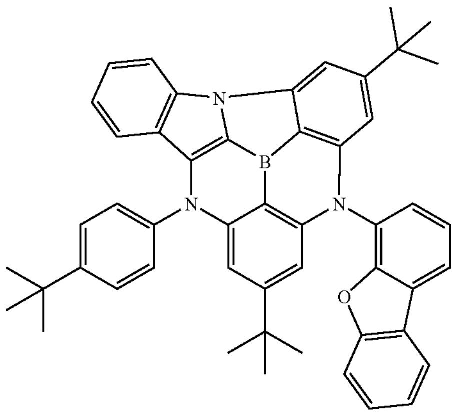
-continued
65
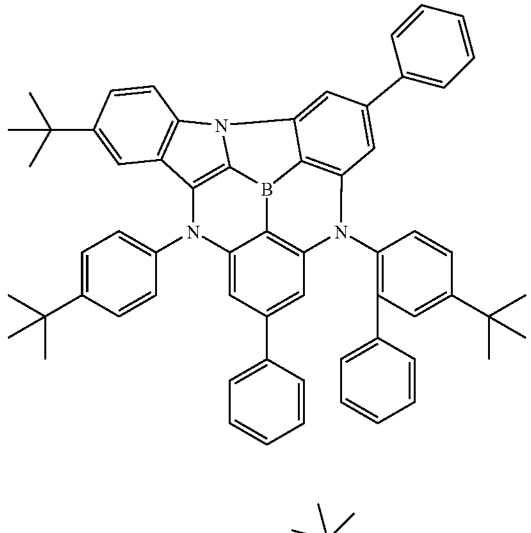
66
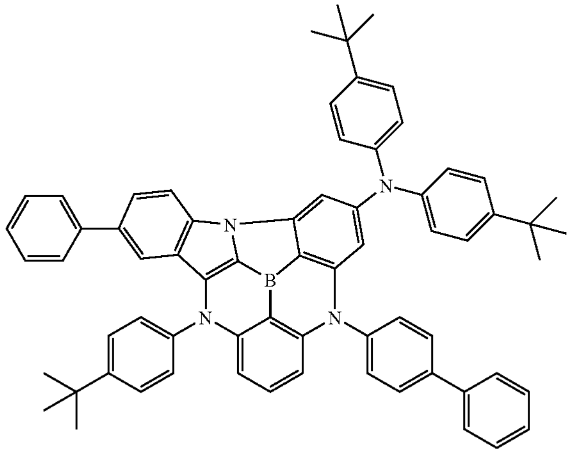
67
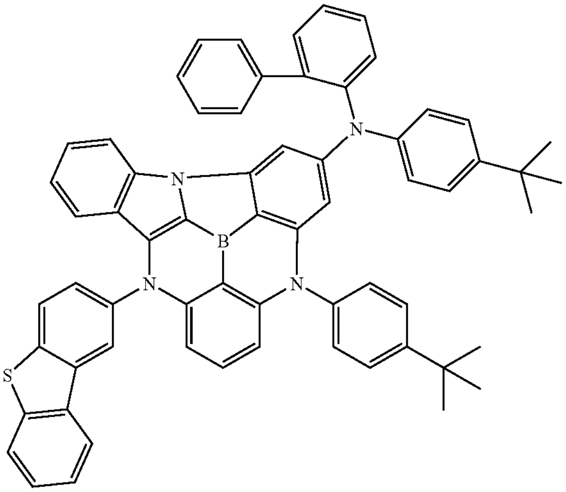

-continued

68

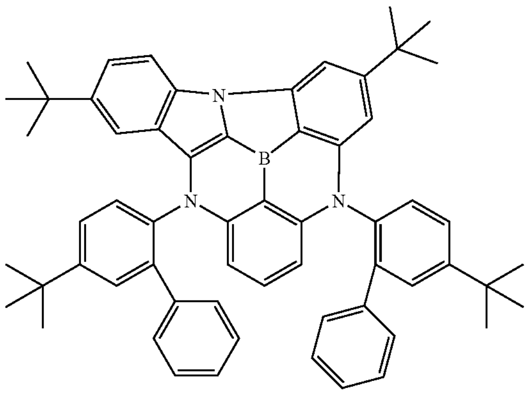

69

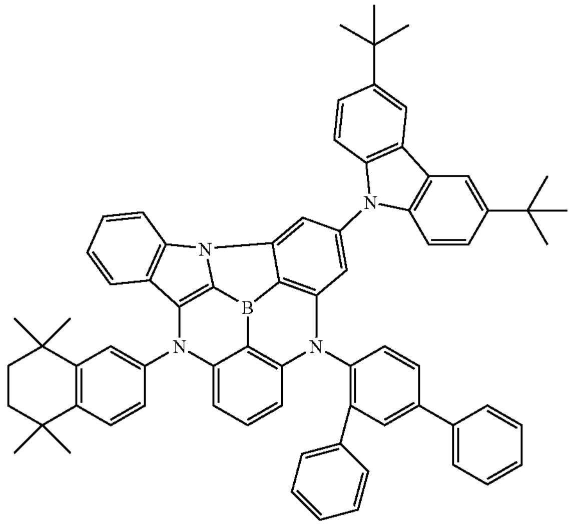

70

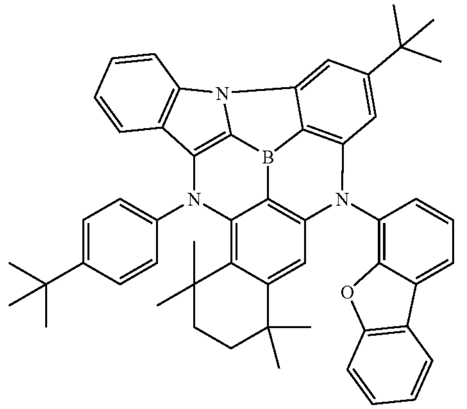

-continued

71

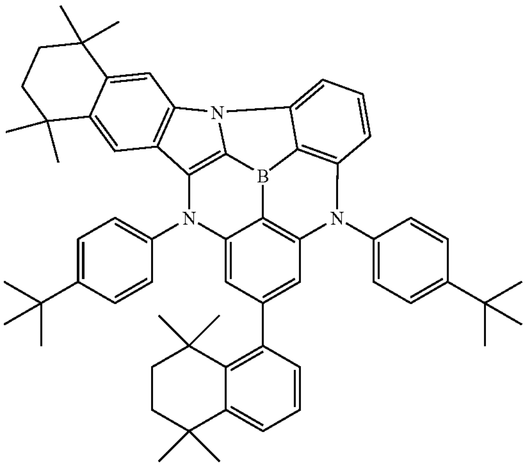

72

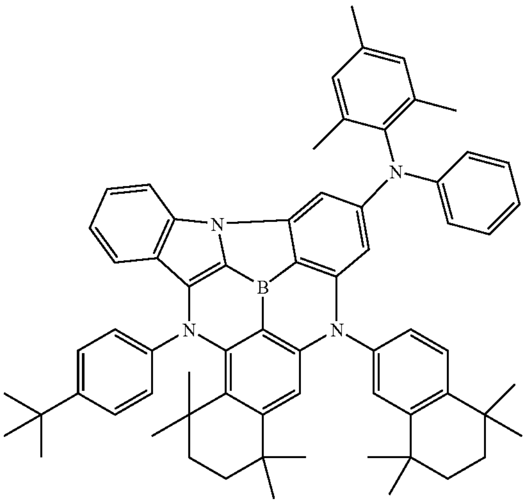

The specific substituents in Formula A can be clearly seen from the structures of the compounds 1 to 72 but are not intended to limit the scope of the compound represented by Formula A.

As can be seen from the above specific compounds, the polycyclic aromatic derivative of the present invention contains B, P, P═O, P═S or Al and has a polycyclic aromatic structure. The introduction of substituents into the polycyclic aromatic structure enables the synthesis of organic materials with inherent characteristics of the substituents. For example, the substituents are designed for use in materials for hole injecting layers, hole transport layers, light emitting layers, electron transport layers, electron injecting layers, electron blocking layers, and hole blocking layers of organic electroluminescent devices. This introduction meets the requirements of materials for the organic layers, making the organic electroluminescent devices highly efficient.

A further aspect of the present invention is directed to an organic electroluminescent device including a first electrode, a second electrode, and one or more organic layers interposed between the first and second electrodes wherein one of the organic layers includes at least one of the organic electroluminescent compounds that can be represented by Formula A.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but are not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer.

According to a preferred embodiment of the present invention, one of the organic layers interposed between the first and second electrodes may be a light emitting layer composed of a host and the compound represented by Formula A as a dopant.

The content of the dopant in the light emitting layer is typically in the range of about 0.01 to about 20 parts by weight, based on about 100 parts by weight of the host but is not limited to this range.

According to a preferred embodiment of the present invention, the host may be an anthracene derivative represented by Formula C:

[Formula C]

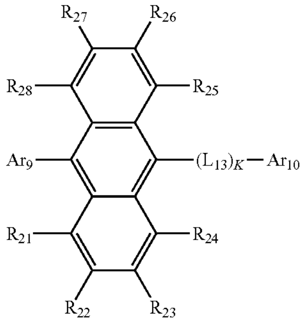

wherein $R_{21}$ to $R_{28}$ are identical to or different from each other and are as defined for R in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, halogen, substituted or unsubstituted amine, and substituted or unsubstituted silyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

According to one embodiment of the present invention, Arg in Formula C may be a substituted or unsubstituted phenyl group or a substituted or unsubstituted naphthyl group.

According to one embodiment of the present invention, the host represented by Formula C may be selected from, but not limited to, the compounds of Formulae C1 to C69:

C1

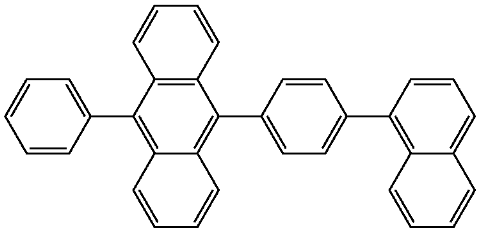

C2

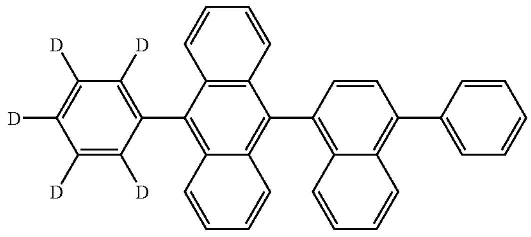

C3

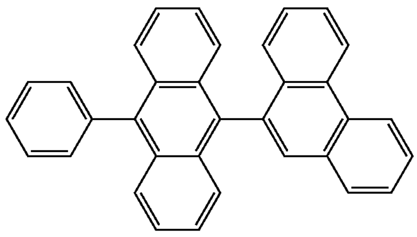

C4

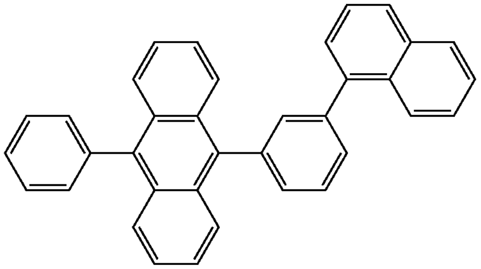

-continued
C5
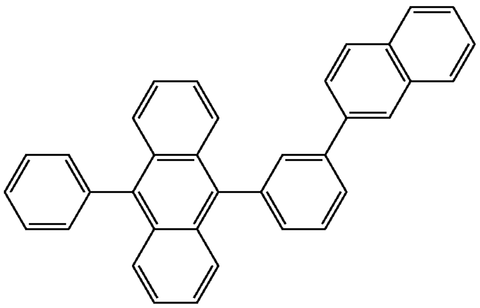
C6
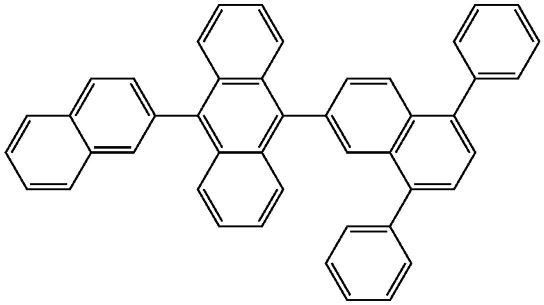
C7
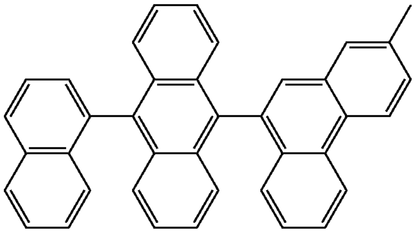
C8
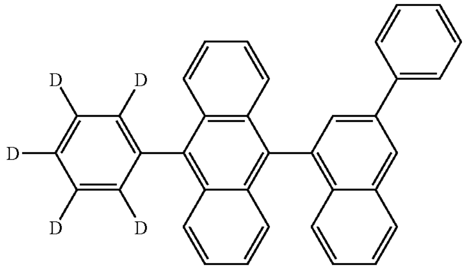
C9
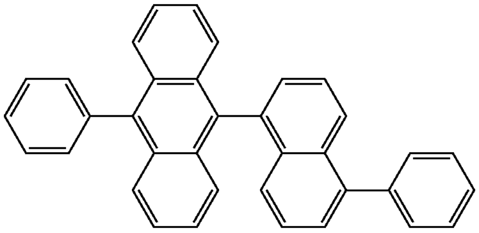
-continued
C10
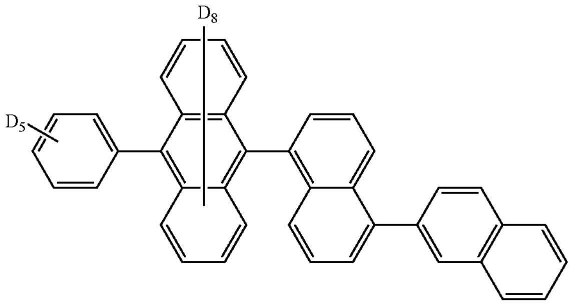
C11
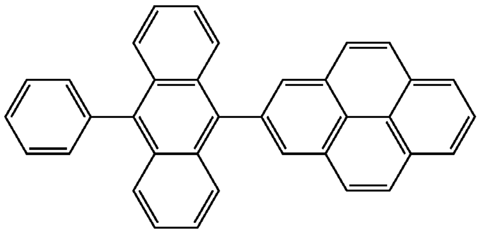
C12
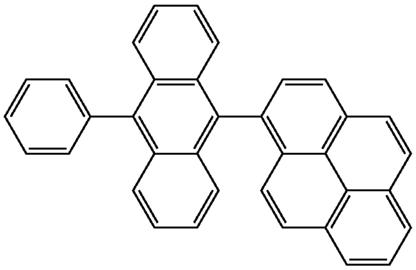
C13
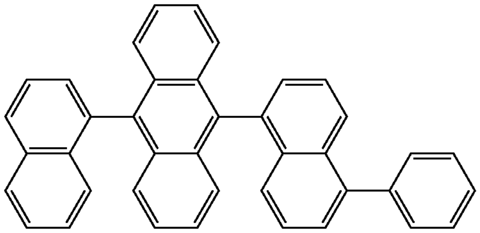
C14
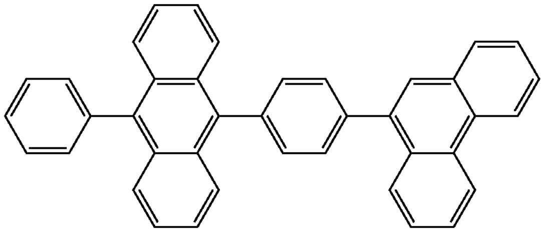

-continued
C15
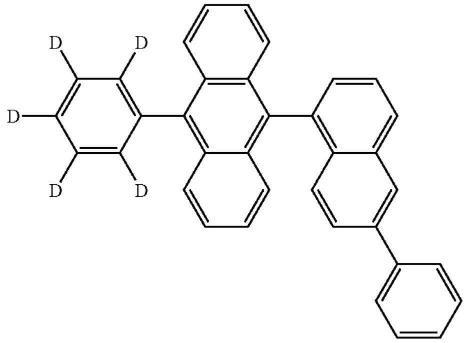
C16
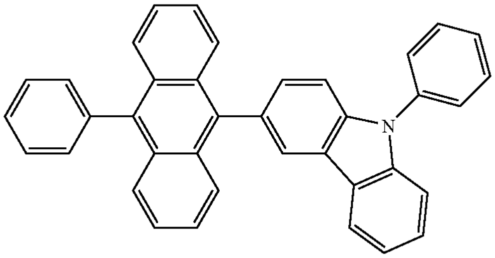
C17
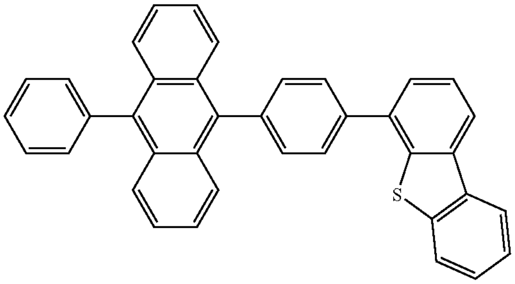
C18
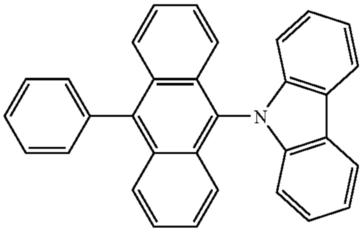
C19
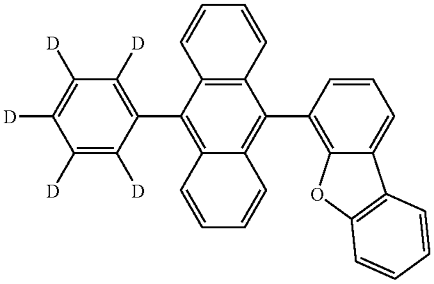
-continued
C20
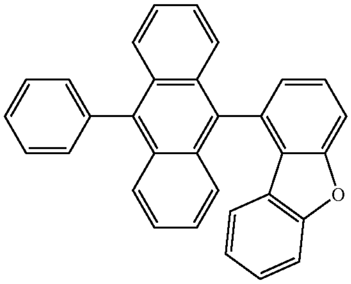
C21
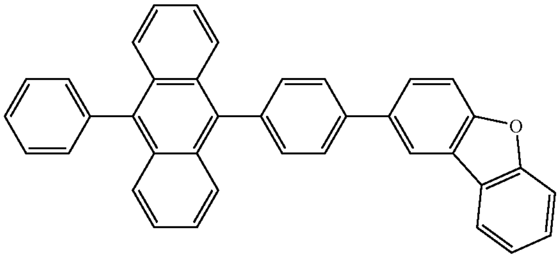
C22
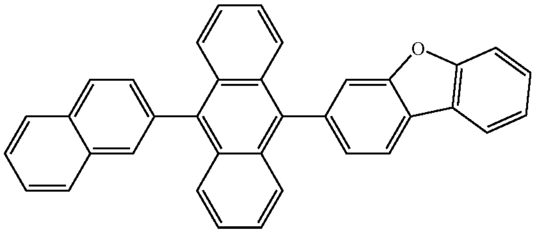
C23
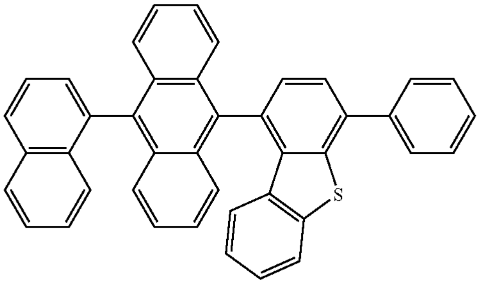
C24
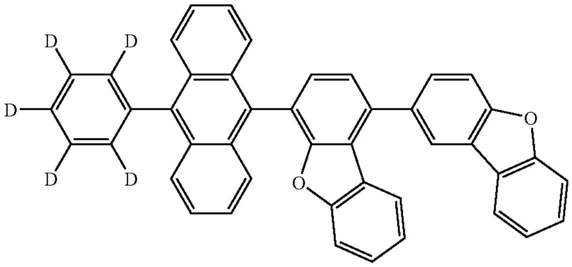

-continued
C25
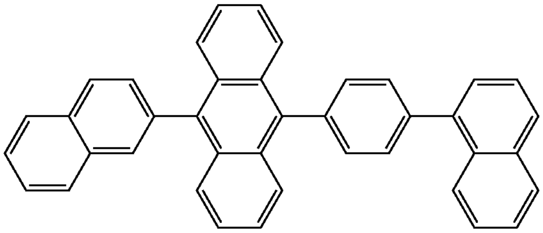
C26
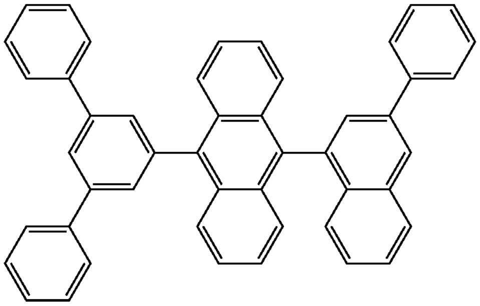
C27
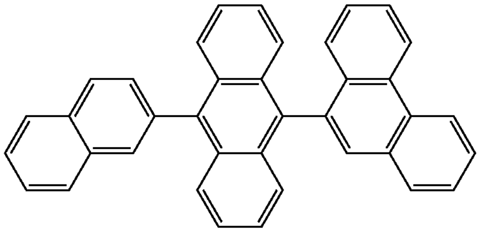
C28
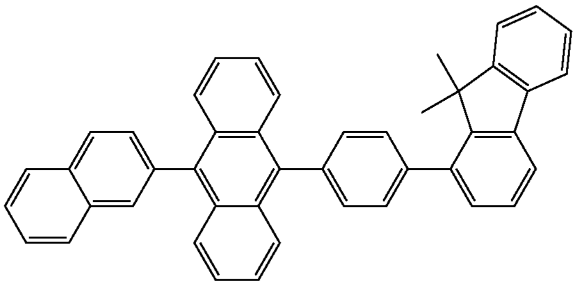
C29
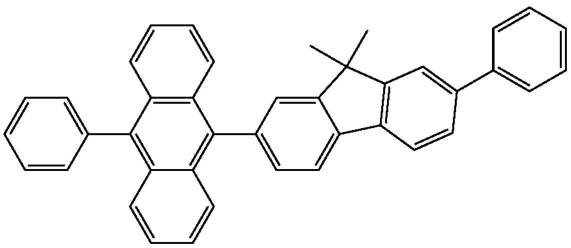
-continued
C30
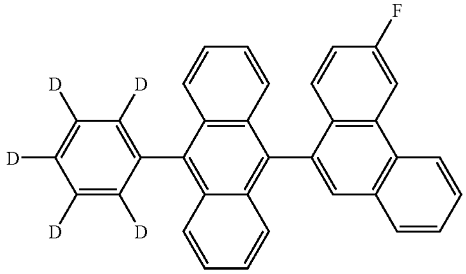
C31
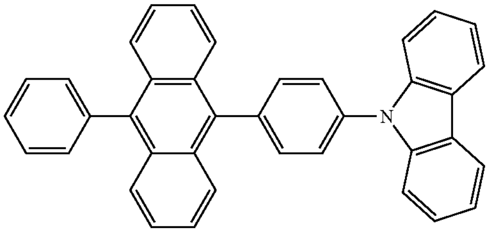
C32
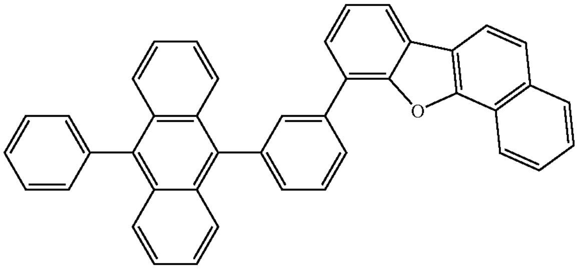
C33
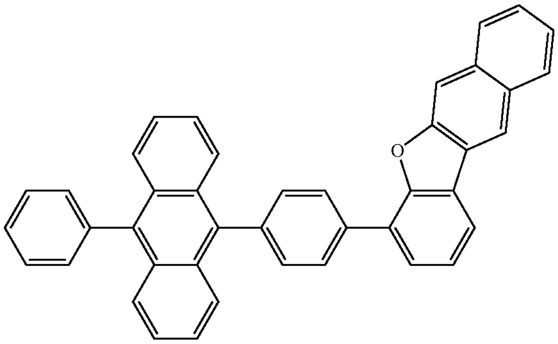
C34
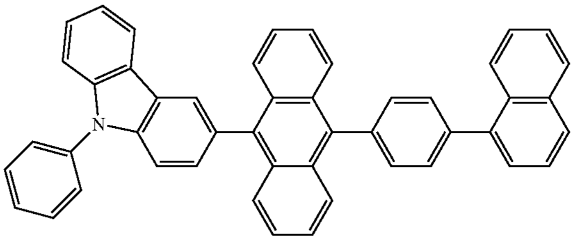

C35
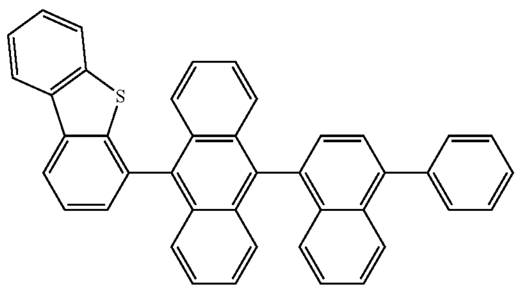
C36
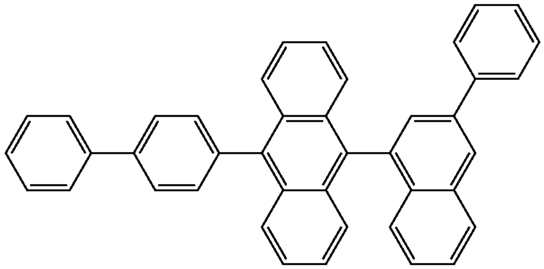
C37
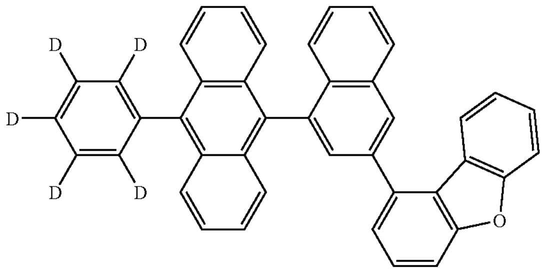
C38
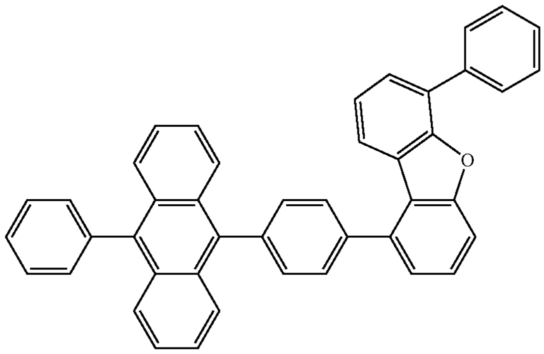
C39
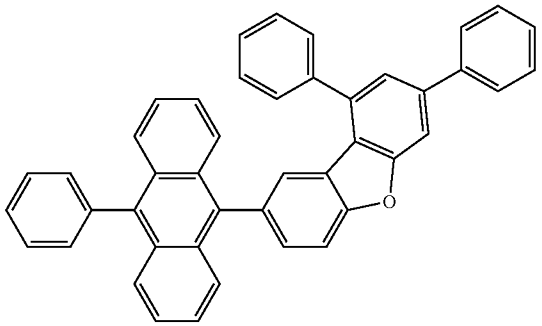
C40
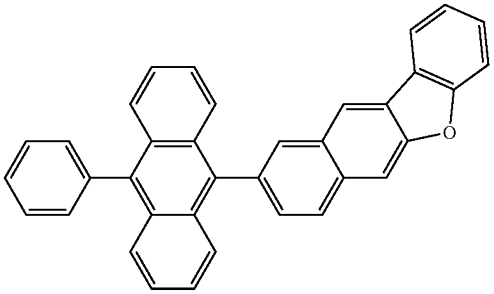
C41
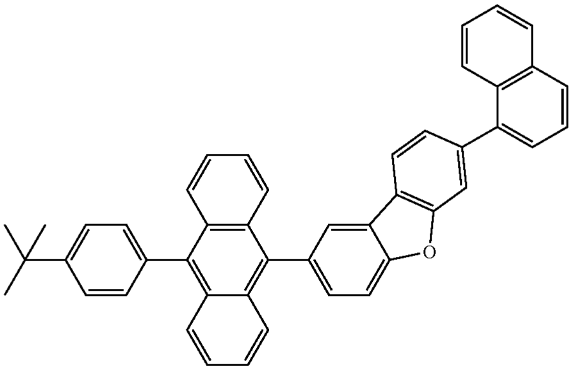
C42
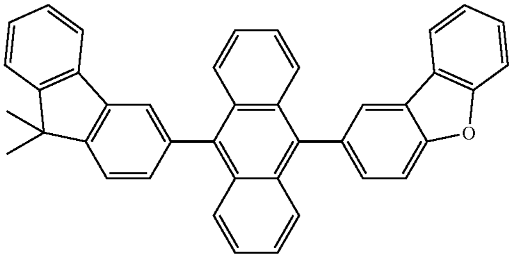
C43
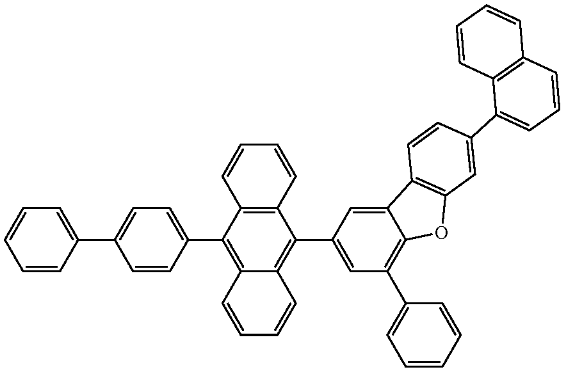

-continued
C44
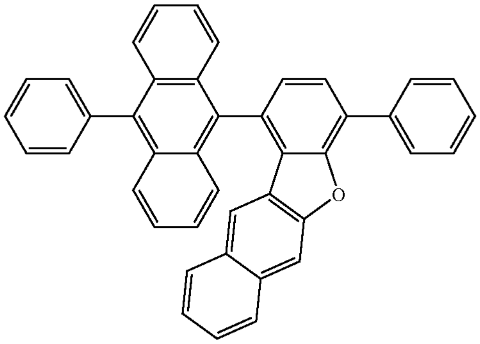
C45
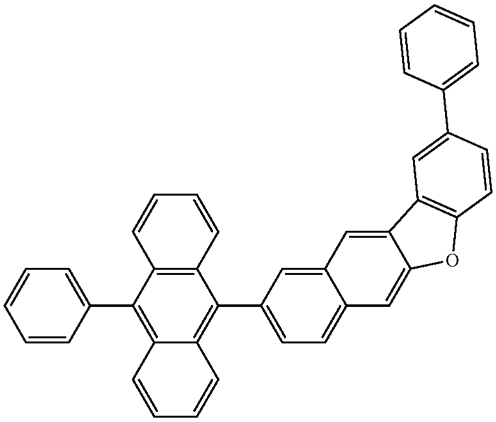
C46
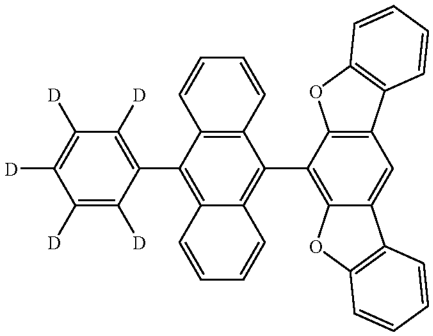
C47
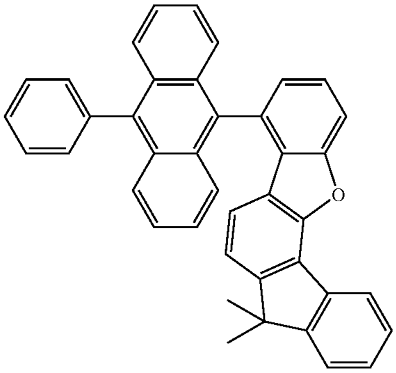
-continued
C48
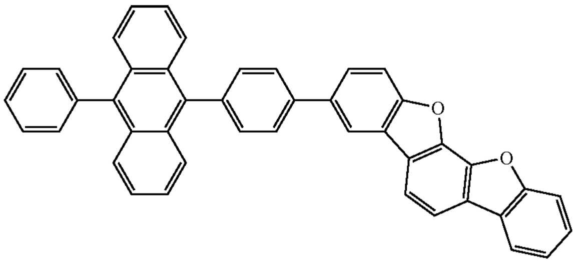
C49
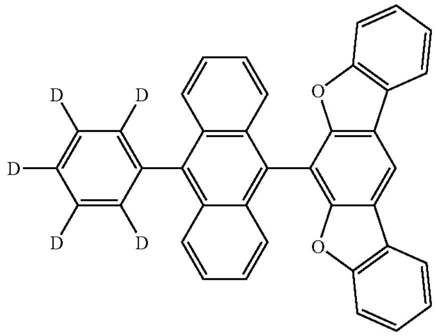
C50
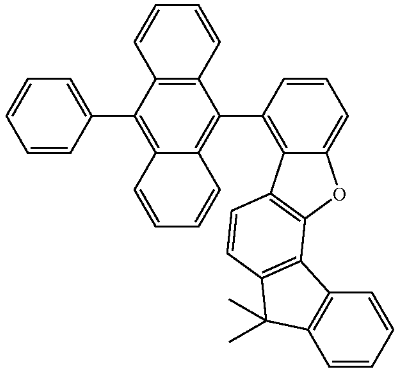
C51
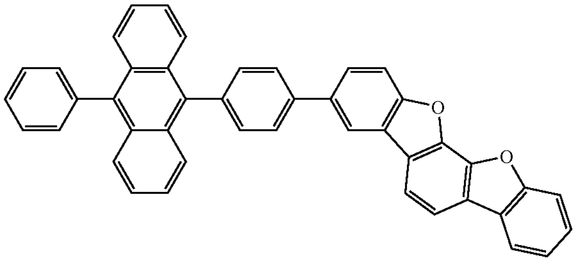
C52
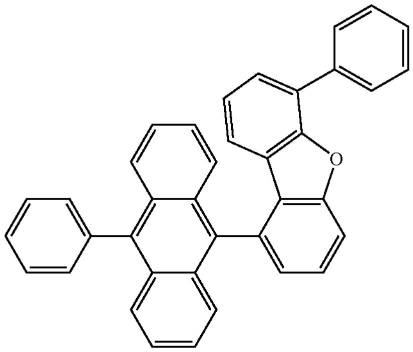

-continued
C53
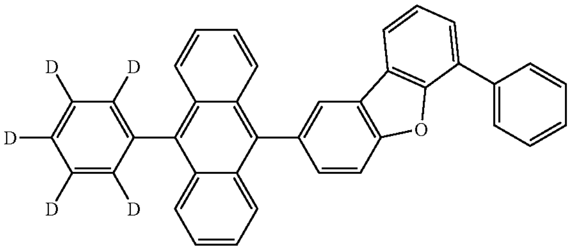
C54
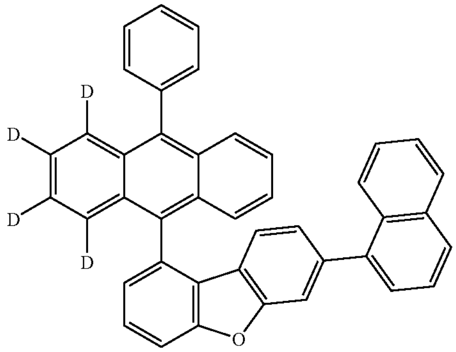
C55
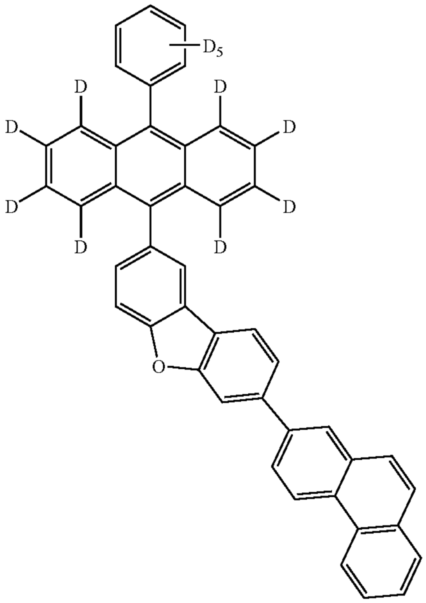
-continued
C56
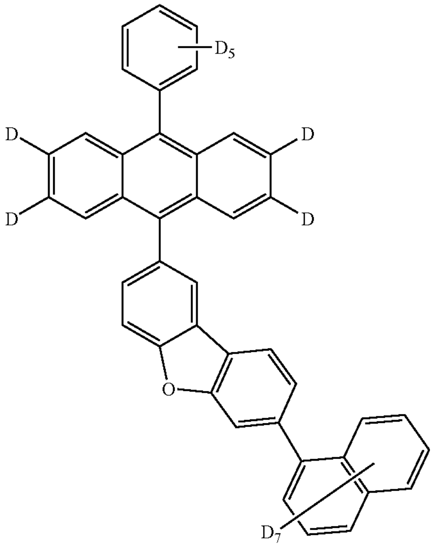
C57
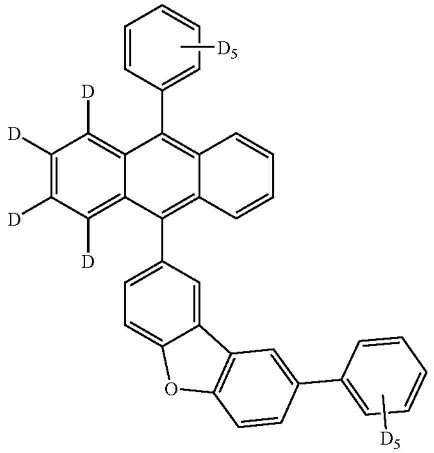
C58
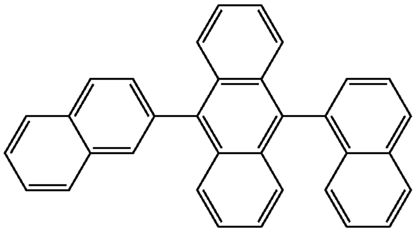
C59
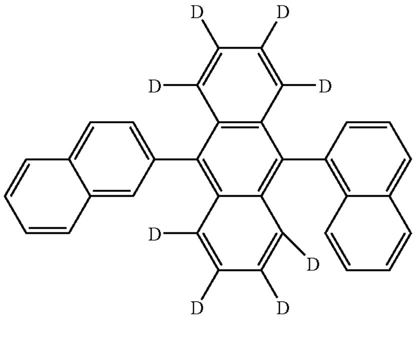

-continued
C60
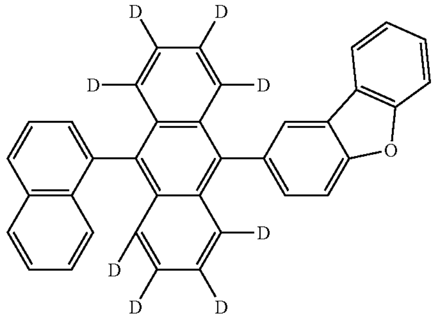
C61
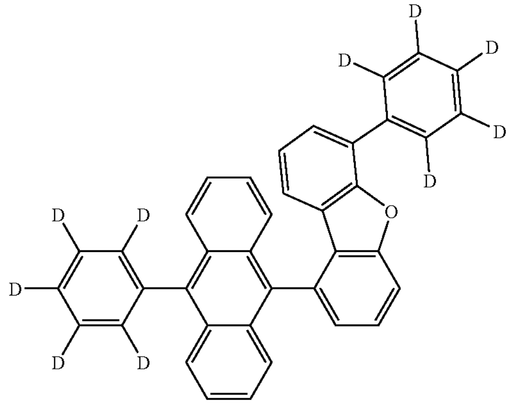
C62
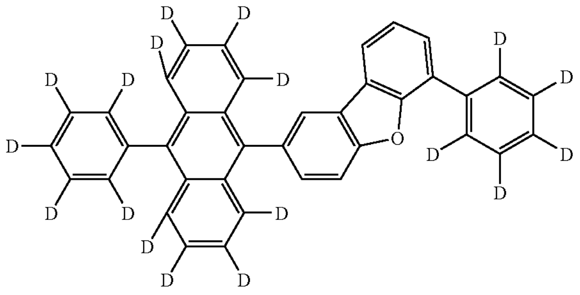
C63
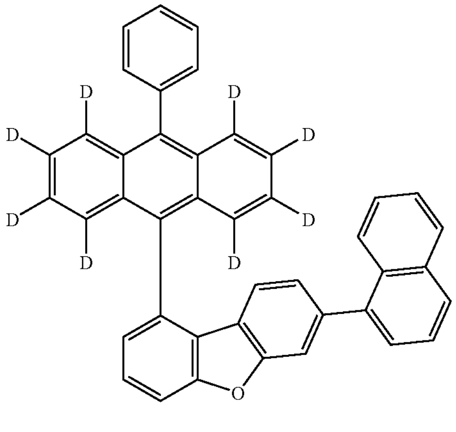
-continued
C64
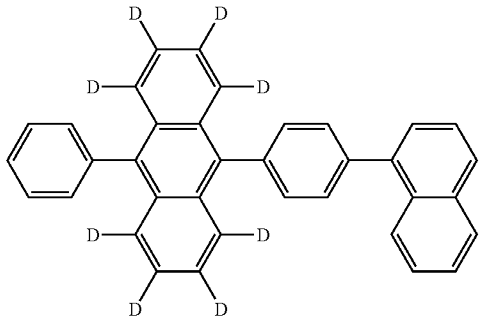
C65
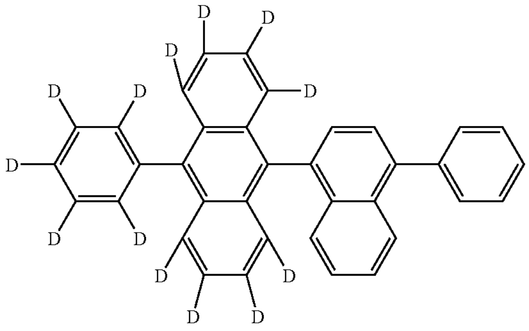
C66
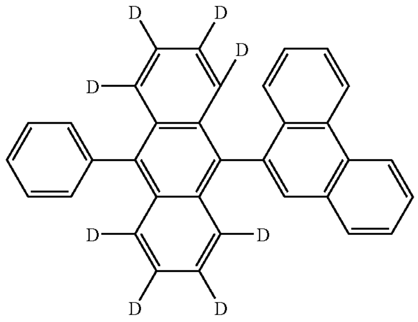
C67
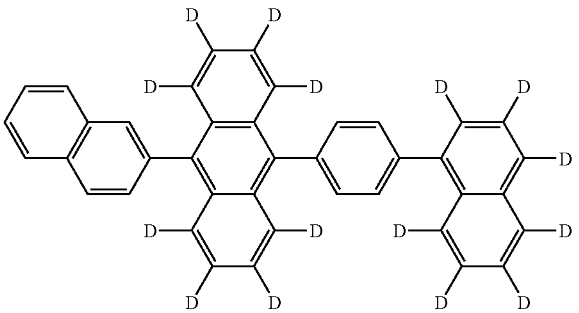
C68
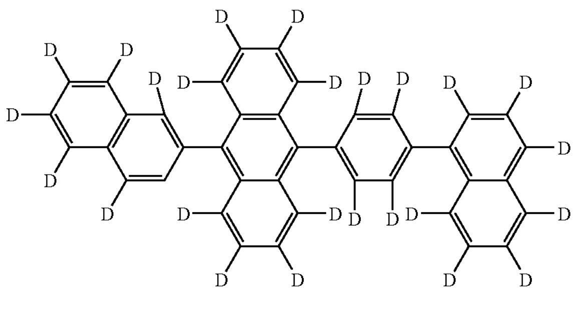

-continued

C69

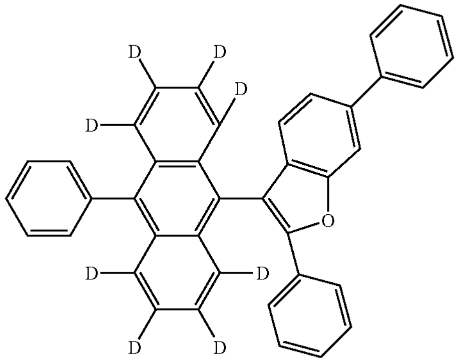

A specific structure of the organic electroluminescent device according to the present invention, a method for fabricating the device, and materials for the organic layers will be described below.

First, an anode material is coated on a substrate to form an anode. The substrate may be any of those used in general organic electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited as long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexacarbonitrile (HAT-CN).

The hole transport material is not specially limited as long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially formed on the hole transport layer. A hole blocking layer may be optionally formed on the light emitting layer by vacuum thermal evaporation or spin coating. The hole blocking layer is formed as a thin film. The hole blocking layer plays a role in blocking holes from entering a cathode through the organic light emitting layer. This role prevents the lifetime and efficiency of the device from deteriorating. To this end, a material having a very low highest occupied molecular orbital (HOMO) energy level is used for the hole blocking layer. The hole blocking material is not particularly limited as long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate) (Bebq2), and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR CARRYING OUT THE INVENTION

The present invention will be explained more specifically with reference to the following examples. However, it will be obvious to those skilled in the art that these examples are in no way intended to limit the scope of the invention.

Synthesis Example 1. Preparation of Compound 64

Synthesis Example 1-1. Synthesis of Intermediate A-1

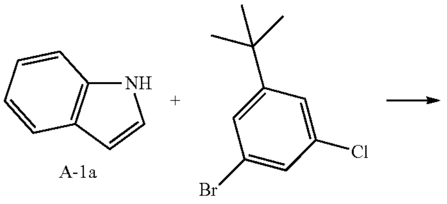

A-1a

A-1b

-continued

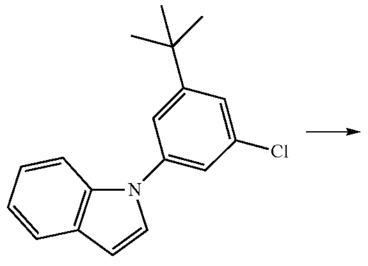

A-1c

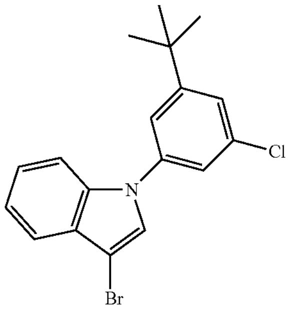

A-1

A-1c was synthesized using A-1a and A-1b with reference to the literature (Tetrahedron Letters, 2011, vol. 52, #11, p. 1161-1164). A-1 (37.3 g, 83.2%) was synthesized from A-1c with reference to the literature (Dyes and Pigments, 2016, vol 133, p. 114-119).

MS (ESI) calcd for Chemical Formula: $C_{18}H_{18}BrClN$ (Pos) 362.03, found 362.0.

Synthesis Example 1-2. Synthesis of Intermediate A-2

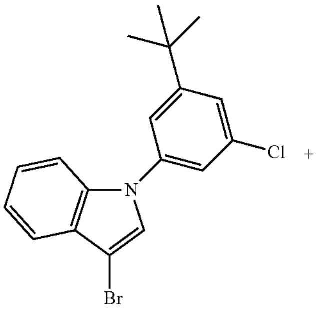

A-1

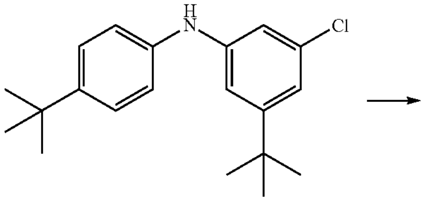

A-2a

-continued

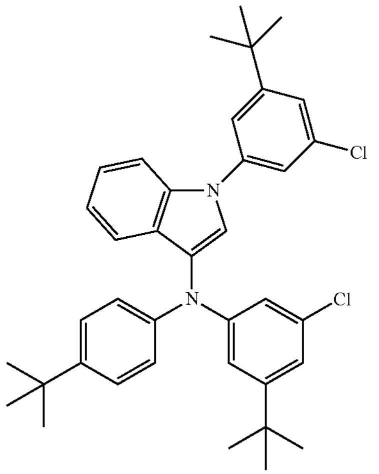

A-2

A-2a was synthesized with reference to U.S. Patent Publication No. 2020/172558 A1. A-2 (15.3 g, yield 91.1%) was synthesized from A-1 and A-2a with reference to the literature (Korean Patent Publication No. 2017/52777 A).

MS (ESI) calcd for Chemical Formula: $C_{38}H_{43}Cl_2N_2$ (Pos) 597.28, found 597.2.

Synthesis Example 1-3. Synthesis of Intermediate A-3

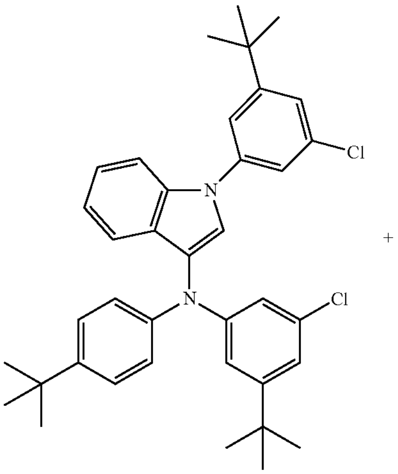

A-2

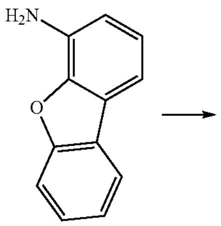

A-3a

-continued

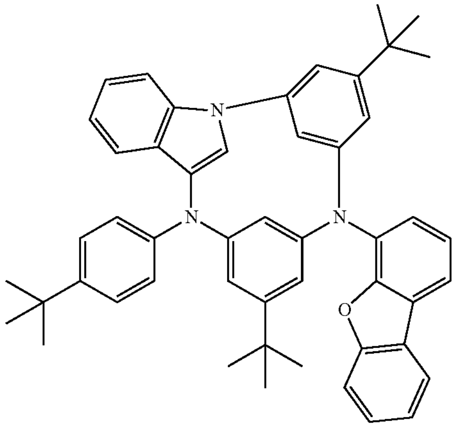

A-3

A-2 (21.7 g), A-3a (6.65 g), bis(tri-tert-butylphosphine) palladium(0) (0.56 g), sodium tert-butoxide (10.5 g), and xylene (200 mL) were placed in a reactor. The mixture was stirred under reflux for 24 h. The reaction mixture was cooled to room temperature and water (200 mL) was added thereto. The organic layer was extracted with ethyl acetate, concentrated under reduced pressure, and purified by silica gel column chromatography to afford A-3 (6.0 g, yield 23.3%).

MS (ESI) calcd for Chemical Formula: $C_{50}H_{50}N_3O$ (Pos) 708.40, found 708.4.

Synthesis Example 1-4. Synthesis of Compound 64

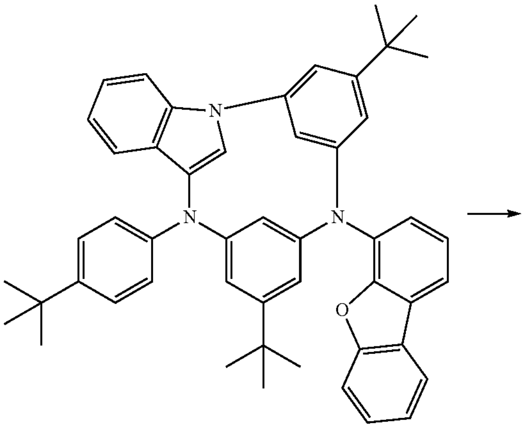

A-3

-continued

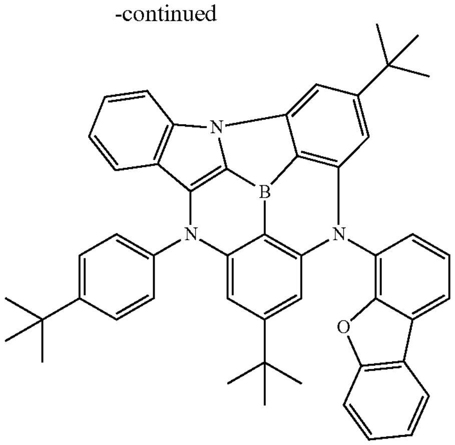

64

A-3 (13.6 g) and dichlorobenzene (140 mL) were placed in a reactor and then boron tribromide (1.8 mL) was added dropwise thereto at room temperature. The mixture was stirred under reflux for 16 h. The reaction mixture was cooled to room temperature and water (60 mL) and sodium acetate (4.7 g) were added thereto. The organic layer was extracted with ethyl acetate, concentrated under reduced pressure, and purified by silica gel column chromatography and subsequent recrystallization to give Compound 64 (1.40 g, yield 10.2%).

MS (ESI) calcd for Chemical Formula: $C_{50}H_{47}BN_3O$ (Pos) 716.38, found 716.3.

Synthesis Example 2. Synthesis of Compound 65

Synthesis Example 2-1. Synthesis of Intermediate B-1

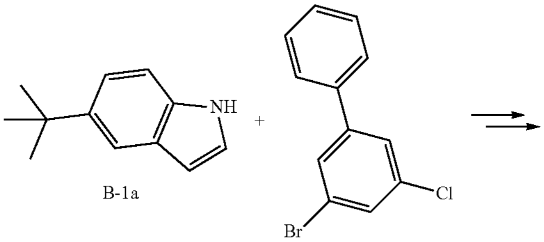

B-1a

B-1b

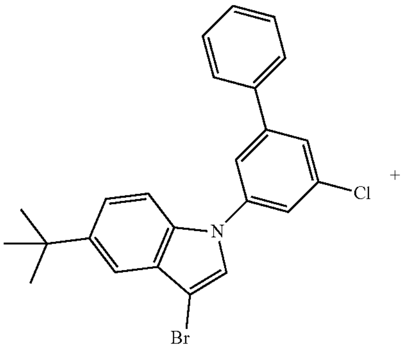

B-1c

-continued

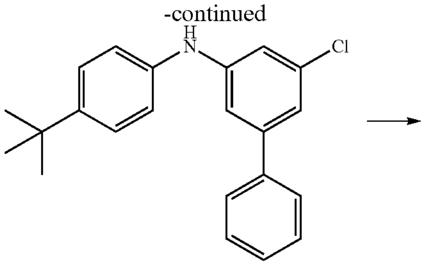

B-1d

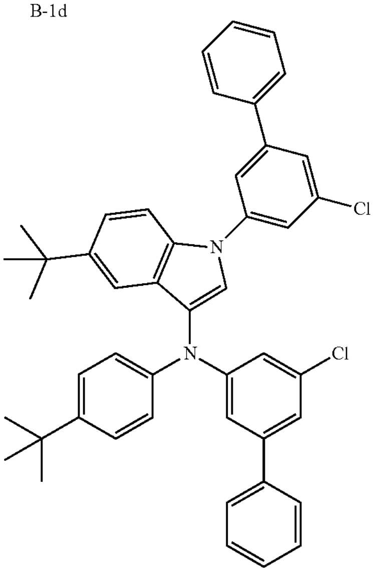

B-1

In the same manner as in Synthesis Example 1, Intermediate B-1c was synthesized from Intermediate B-1a and Intermediate B-1 (88.1%) was synthesized from Intermediate B-1c.

MS (ESI) calcd for Chemical Formula: $C_{46}H_{43}Cl_2N_2$ (Pos) 693.28, found 693.2.

Synthesis Example 2-2. Synthesis of Compound 65

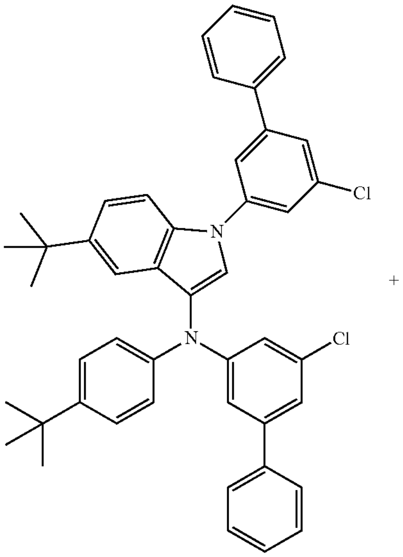

B-2a

-continued

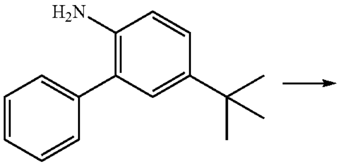

B-2b

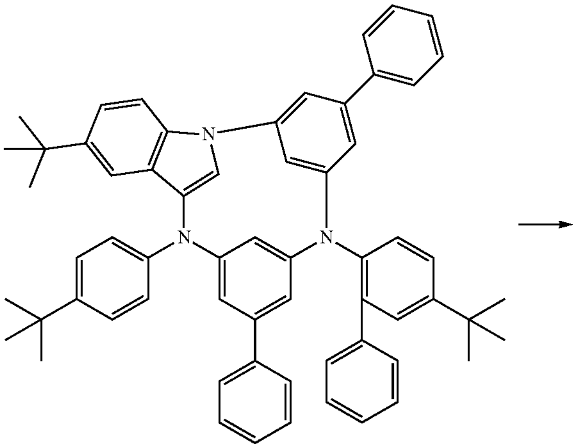

B-2c

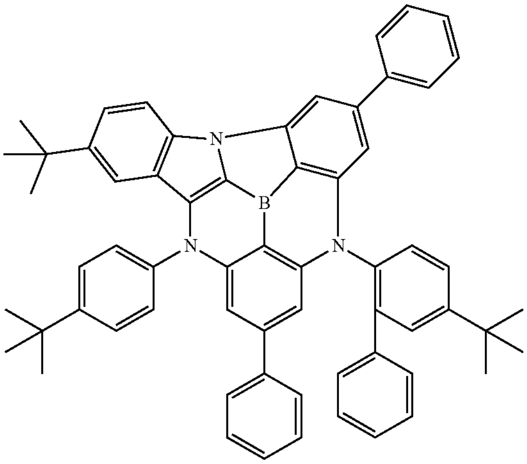

65

In the same manner as in Synthesis Example 1, Intermediate B-2c was synthesized from Intermediate B-2a and Compound 65 (9.4%) was synthesized from Intermediate B-2c.

MS (ESI) calcd for Chemical Formula: $C_{62}H_{57}BN_3$ (Pos) 854.47, found 854.4.

Synthesis Example 3. Synthesis of Compound 66

Synthesis Example 3-1. Synthesis of Intermediate C-1

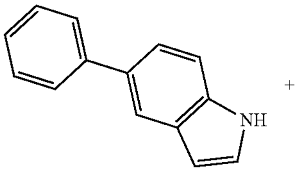

C-1a

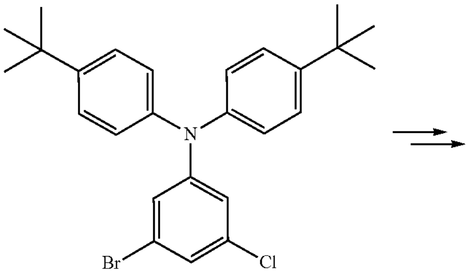

C-1b

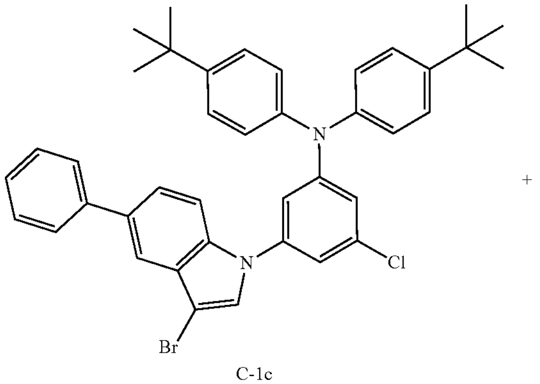

C-1c

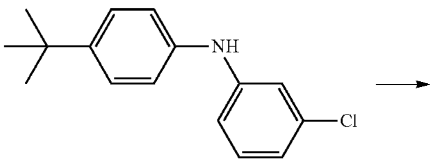

C-1d

-continued

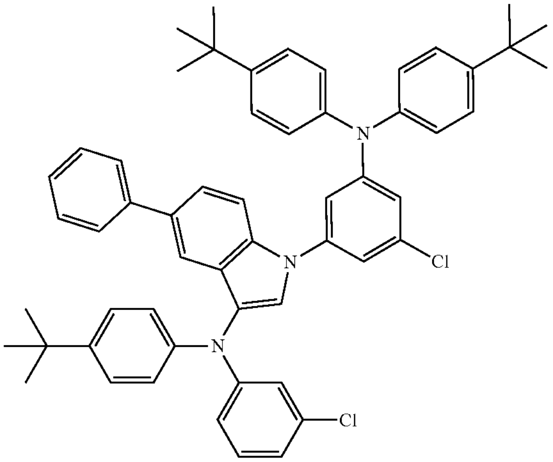

C-1

In the same manner as in Synthesis Example 1, Intermediate C-1c was synthesized from Intermediate C-1a and Intermediate C-1 (90.1%) was synthesized from Intermediate C-1c.

MS (ESI) calcd for Chemical Formula: $C_{56}H_{56}Cl_2N_3$ (Pos) 840.39, found 840.3.

Synthesis Example 3-2. Synthesis of Compound 66

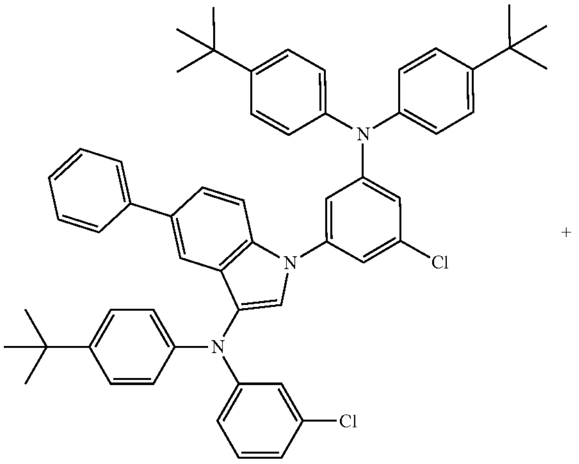

C-2a

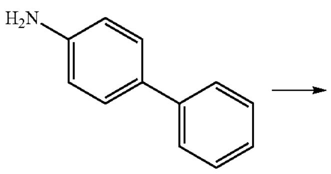

C-2b

-continued

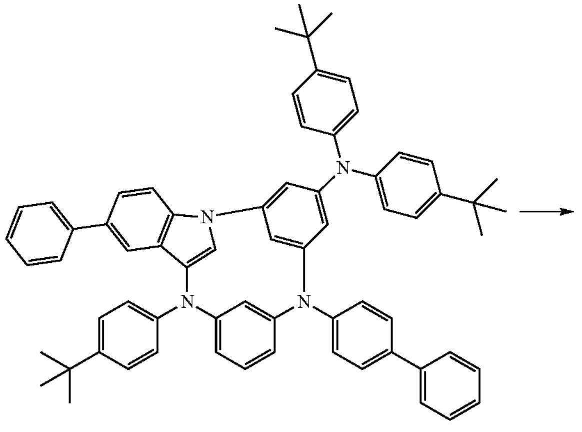

C-2c

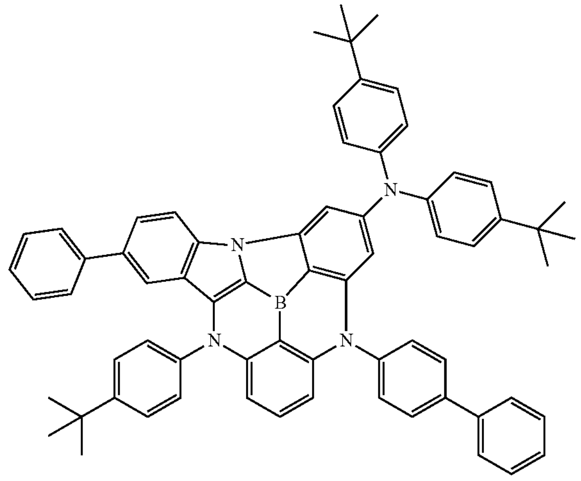

66

In the same manner as in Synthesis Example 1, Intermediate C-2c was synthesized from Intermediate C-2a and Compound 66 (14.1%) was synthesized from Intermediate C-2c.

MS (ESI) calcd for Chemical Formula: $C_{68}H_{62}BN_4$ (Pos) 945.51, found 945.5.

Synthesis Example 4. Synthesis of Compound 67

Synthesis Example 4-1. Synthesis of Intermediate D-1

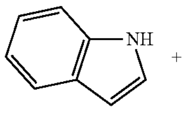

D-1a

-continued

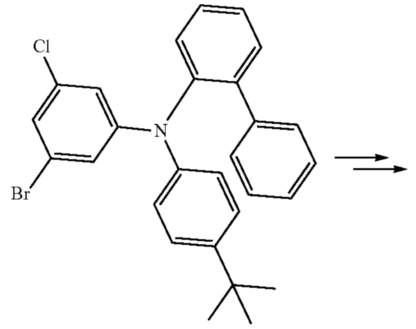

D-1b

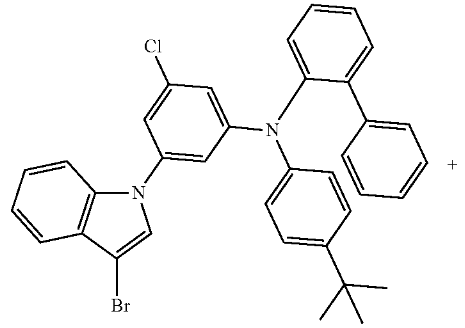

D-1c

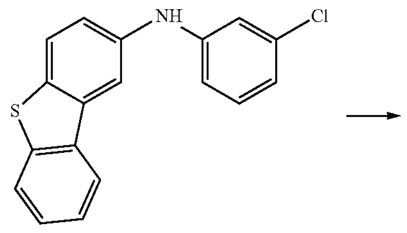

D-1d

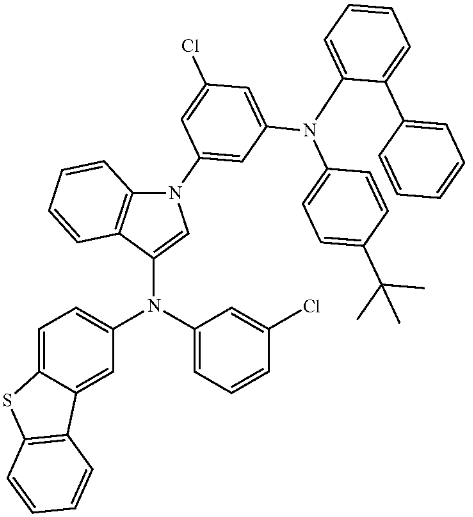

D-1

In the same manner as in Synthesis Example 1, Intermediate D-1c was synthesized from Intermediate D-1a and Intermediate D-1 (81.2%) was synthesized from Intermediate D-1c.

MS (ESI) calcd for Chemical Formula: $C_{54}H_{42}Cl_2N_3O$, (Pos) 834.25, found 834.2.

Synthesis Example 4-2. Synthesis of Compound 67
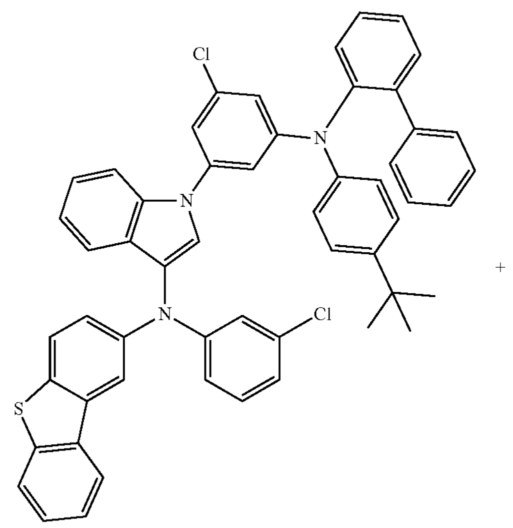
D-2a
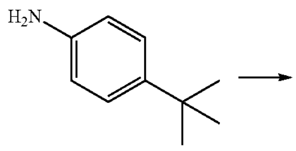
D-2b
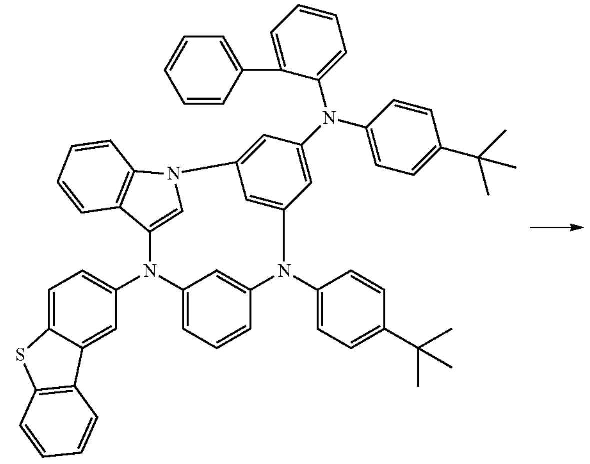
D-2c
-continued
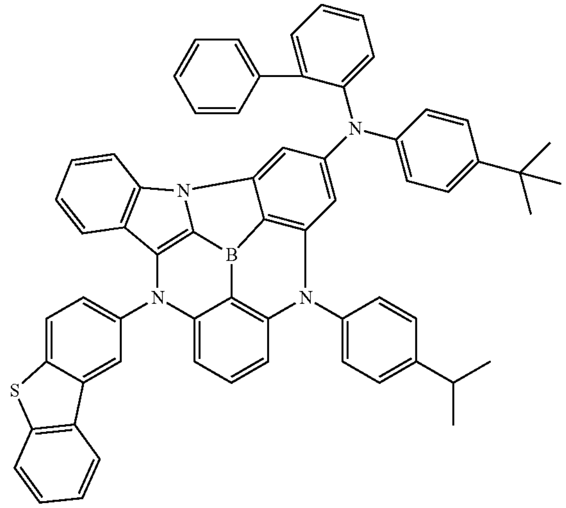
67
In the same manner as in Synthesis Example 1, Intermediate D-2c was synthesized from Intermediate D-2a and Compound 67 (9.3%) was synthesized from Intermediate D-2c.
MS (ESI) calcd for Chemical Formula: $C_{64}H_{52}BN_4S$ (Pos) 919.40, found 919.4.
Synthesis Example 5. Synthesis of Compound 68
Synthesis Example 5-1. Synthesis of Intermediate E-1
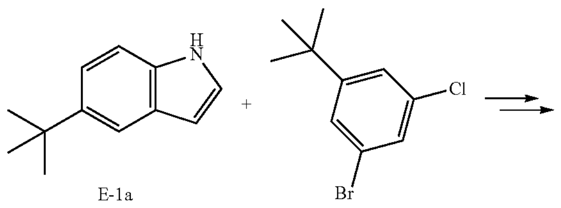
E-1a E-1b
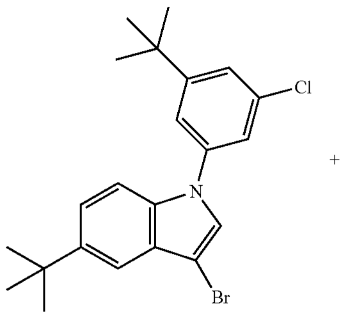
E-1c -continued

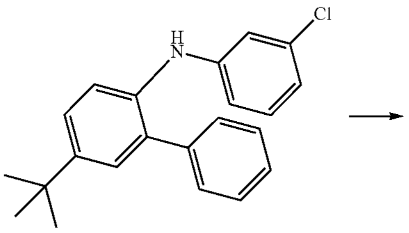

E-1d

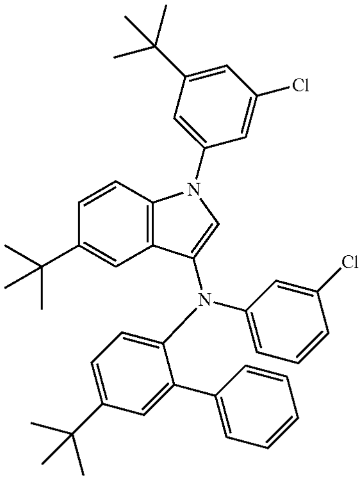

E-1

In the same manner as in Synthesis Example 1, Intermediate E-1c was synthesized from Intermediate E-1a and Intermediate E-1 (76.5%) was synthesized from Intermediate E-1c.

MS (ESI) calcd for Chemical Formula: $C_{44}H_{47}Cl_2N_2$ (Pos) 673.31, found 673.3.

Synthesis Example 5-2. Synthesis of Compound 68

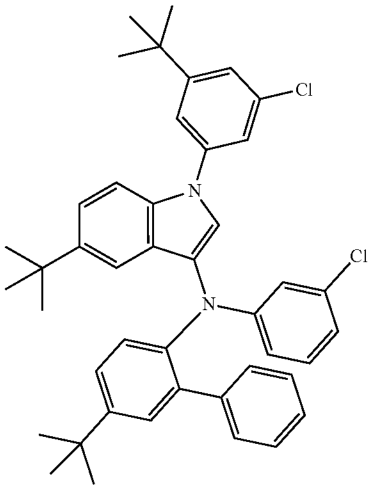

+

E-2a

-continued

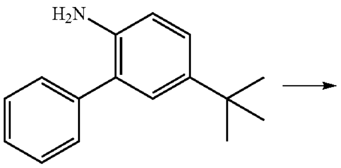

E-2b

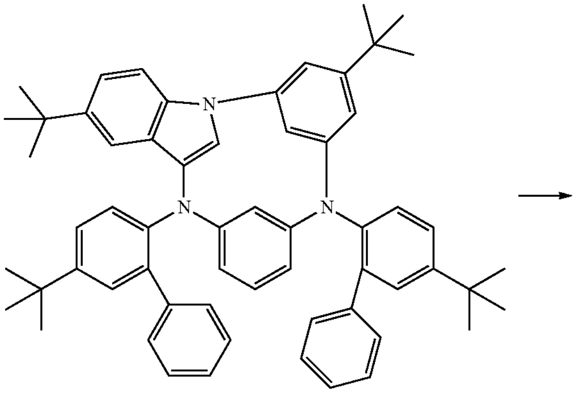

E-2c

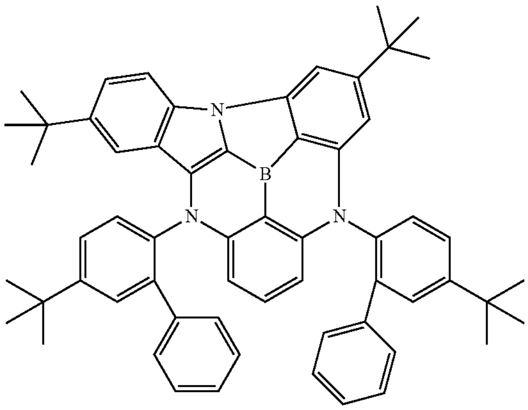

68

In the same manner as in Synthesis Example 1, Intermediate E-2c was synthesized from Intermediate E-2a and Compound 68 (8.9%) was synthesized from Intermediate E-2c.

MS (ESI) calcd for Chemical Formula: $C_{60}H_{61}BN_3$ (Pos) 834.50, found 834.5.

Synthesis Example 6. Synthesis of Compound 69

Synthesis Example 6-1. Synthesis of Intermediate F-1

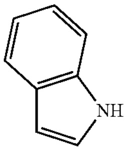

+

F-1a

-continued
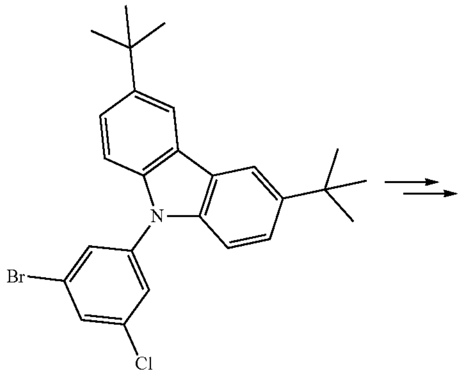
F-1b
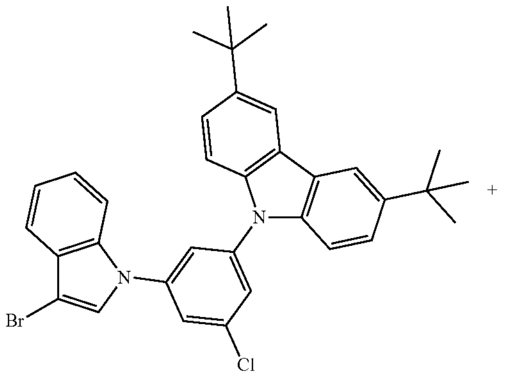
F-1c
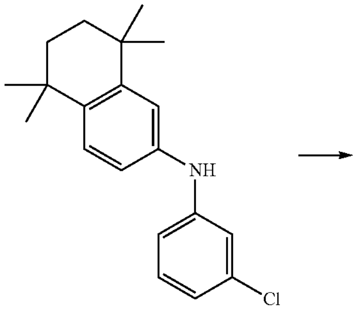
F-1d
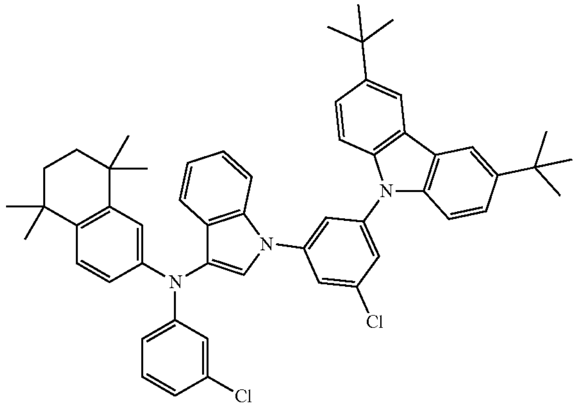
F-1
In the same manner as in Synthesis Example 1, Intermediate F-1c was synthesized from Intermediate F-1a and Intermediate F-1 (72.4%) was synthesized from Intermediate F-1c.
MS (ESI) calcd for Chemical Formula: $C_{54}H_{56}Cl_2N_3$ (Pos) 816.39, found 816.3.
Synthesis Example 6-2. Synthesis of Compound 69
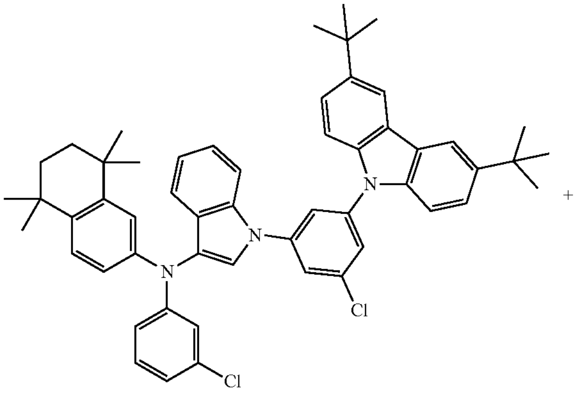
F-2a
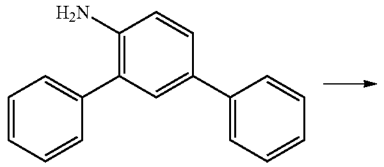
F-2b
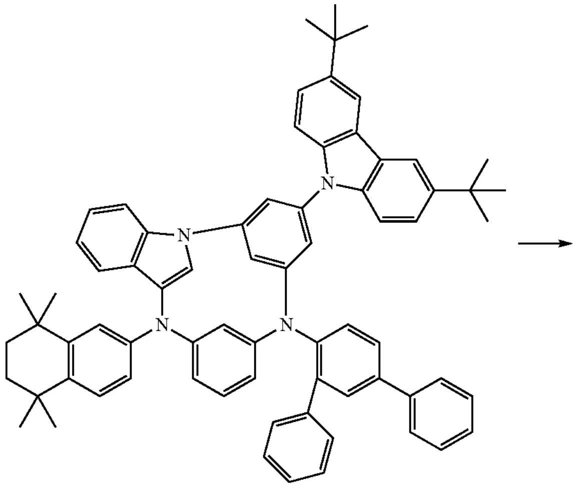
F-2c -continued

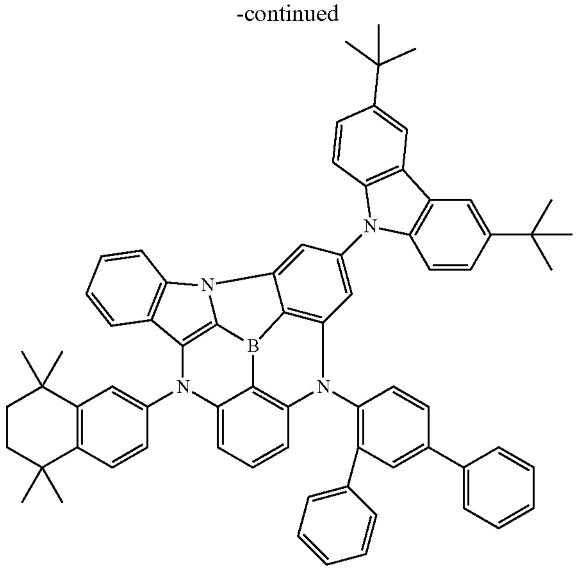

69

In the same manner as in Synthesis Example 1, Intermediate F-2c was synthesized from Intermediate F-2a and Compound 69 (8.5%) was synthesized from Intermediate F-2c.

MS (ESI) calcd for Chemical Formula: $C_{72}H_{66}BN_4$ (Pos) 997.54, found 997.5.

Examples 1-10: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. DNTPD (700 Å) and the compound represented by Formula H (250 Å) were deposited in this order on the ITO. A mixture of the compound represented by BH1 as a host and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

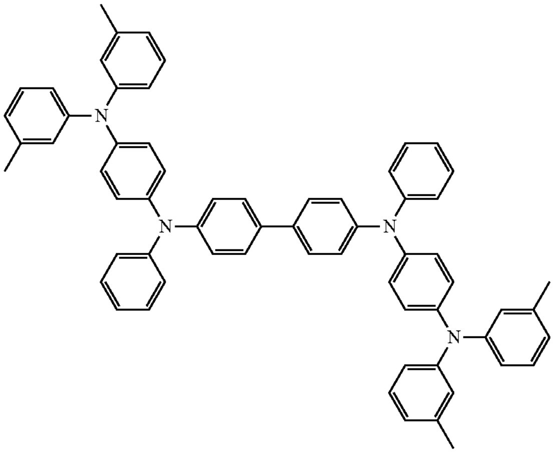

[DNTPD]

[Formula H]

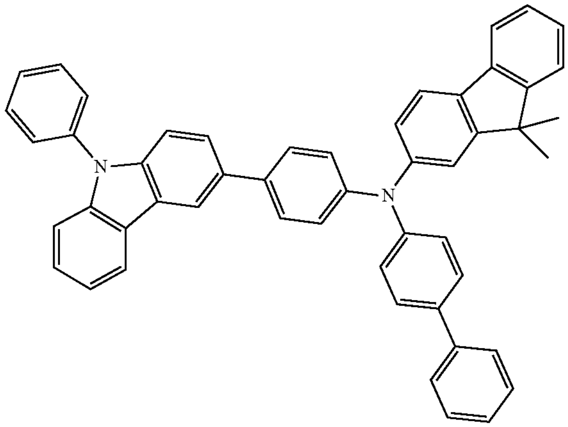

[Formula E-1]

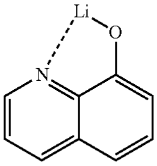

[Formula E-2]

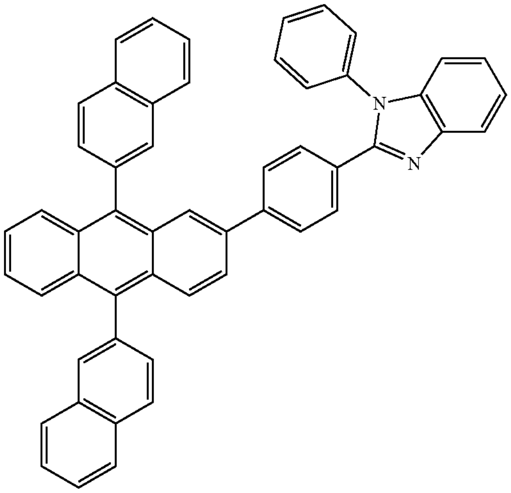

-continued

[BH1]

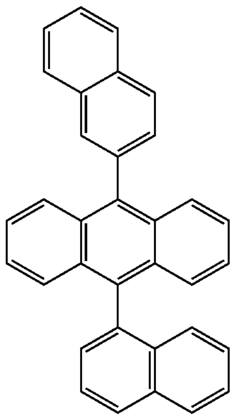

Comparative Example 1

An organic electroluminescent device was fabricated in the same manner as in Examples 1, except that BD1 was used instead of the inventive compound. The luminescent properties of the organic electroluminescent device were measured at 0.4 mA.

[BD1]

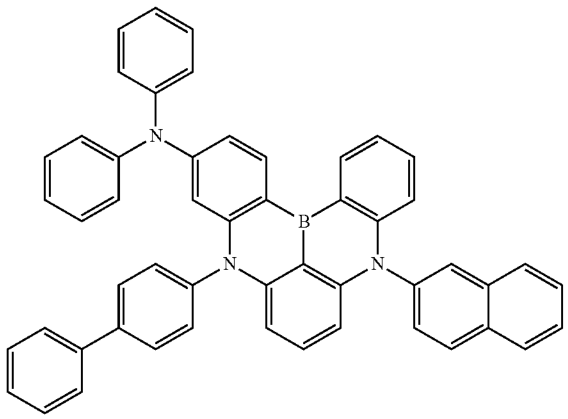

The organic electroluminescent devices of Examples 1-10 and Comparative Example 1 were measured for external quantum efficiency and lifetime. The results are shown in Table 1.

TABLE 1

| Example No. | Host | Dopant | External quantum efficiency (%) | T90 (hr) |
|---|---|---|---|---|
| Example 1 | BH1 | Compound 7 | 8.1 | 154 |
| Example 2 | BH1 | Compound 11 | 8.0 | 160 |
| Example 3 | BH1 | Compound 18 | 8.3 | 150 |
| Example 4 | BH1 | Compound 23 | 8.2 | 157 |
| Example 5 | BH1 | Compound 64 | 8.2 | 180 |
| Example 6 | BH1 | Compound 65 | 8.3 | 140 |
| Example 7 | BH1 | Compound 66 | 8.1 | 155 |
| Example 8 | BH1 | Compound 67 | 8.1 | 152 |
| Example 9 | BH1 | Compound 68 | 8.0 | 149 |
| Example 10 | BH1 | Compound 69 | 8.3 | 160 |
| Comparative Example 1 | BH1 | BD1 | 6.0 | 90 |

As can be seen from the results in Table 1, the organic electroluminescent devices of Examples 1-10, each of which employed the inventive compound, showed higher luminous efficiencies and longer lifetimes than the organic electroluminescent of Comparative Example 1.

INDUSTRIAL APPLICABILITY

The polycyclic aromatic derivative of the present invention can be used to fabricate a highly efficient and long-lasting organic electroluminescent device with significantly improved luminous efficiency. Therefore, the polycyclic aromatic derivative of the present invention can find useful industrial applications in various displays, including flat panel displays and flexible displays, and lighting systems, including monochromatic flat panel lighting systems, white flat panel lighting systems, flexible monochromatic lighting systems, and flexible white lighting systems.

What is claimed is:

1. An organic compound represented by Formula A:

[Formula A]

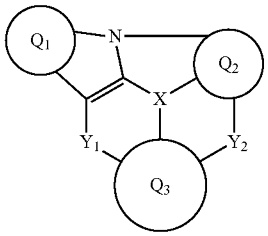

wherein $Q_1$ is selected from substituted or unsubstituted $C_6$-$C_{50}$ monocyclic or polycyclic aromatic hydrocarbon rings, substituted or unsubstituted $C_2$-$C_{50}$ monocyclic or polycyclic aromatic heterocyclic rings, substituted or unsubstituted $C_6$-$C_{50}$ monocyclic or polycyclic aliphatic hydrocarbon rings, and substituted or unsubstituted $C_2$-$C_{50}$ monocyclic or polycyclic aliphatic heterocyclic rings, $Q_2$ and $Q_3$ are the same as or different from each other and are each independently selected from substituted or unsubstituted $C_6$-$C_{50}$ monocyclic or polycyclic aromatic hydrocarbon rings and substituted or unsubstituted $C_2$-$C_{50}$ monocyclic or polycyclic aromatic heterocyclic rings, X is B, $Y_1$ and $Y_2$ are the same as or different from each other and are each independently $R_1$ is selected from hydrogen, deuterium, substituted or unsubstituted $C_1$-$C_{30}$ alkyl, substituted or unsubstituted $C_1$-$C_{30}$ alkenyl, substituted or unsubstituted $C_6$-$C_{50}$ aryl, substituted or unsubstituted $C_3$-$C_{30}$ cycloalkyl, substituted or unsubstituted C2-C30 heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, nitro, cyano, and halogen, with the proviso that $R_1$ is optionally bonded to at least one of the rings $Q_1$ to $Q_3$ to form an alicyclic or aromatic monocyclic or polycyclic ring.

2. The organic compound according to claim 1, wherein the organic compound is selected from the following compounds:

1

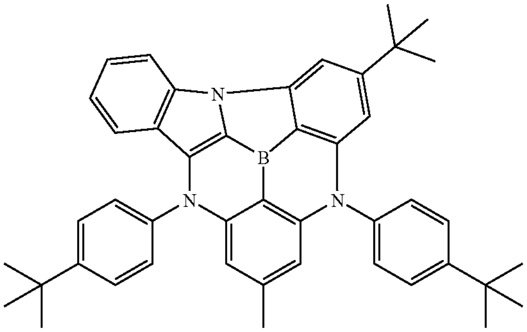

2

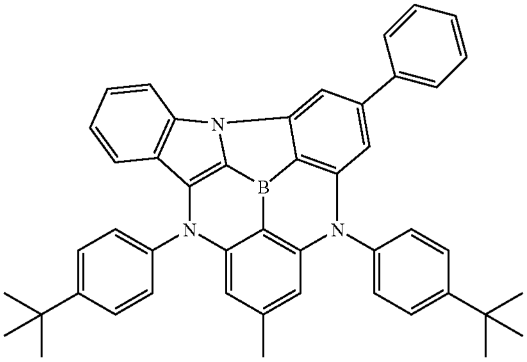

3

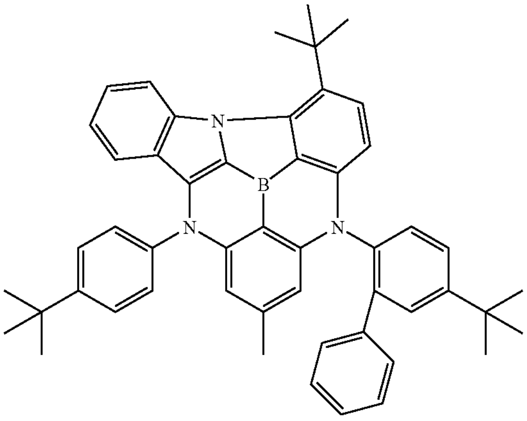

-continued

4

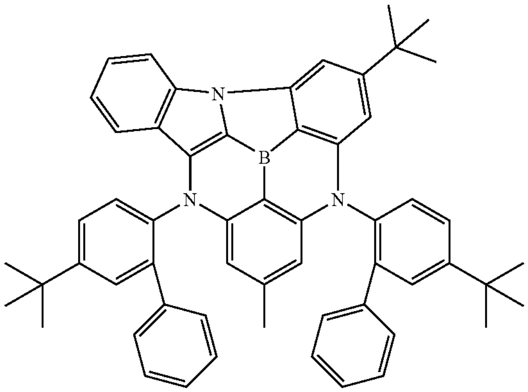

5

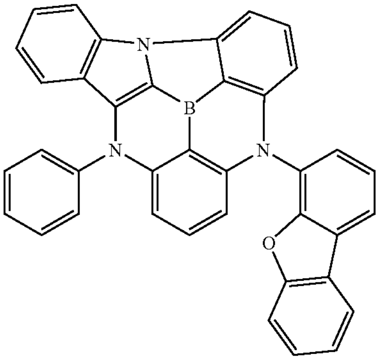

6

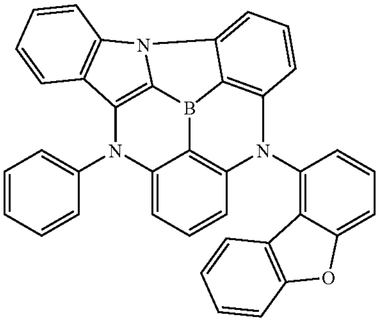

7

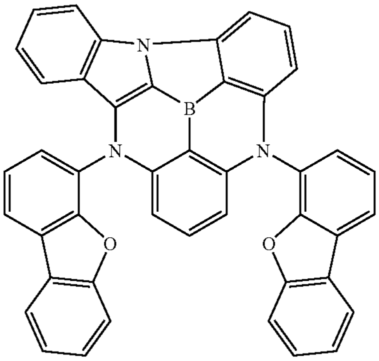

8
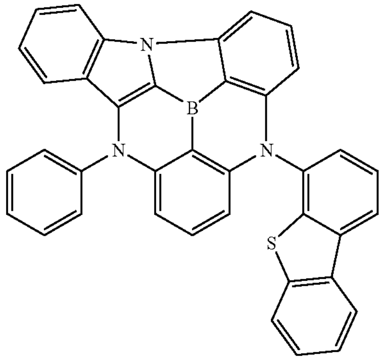
9
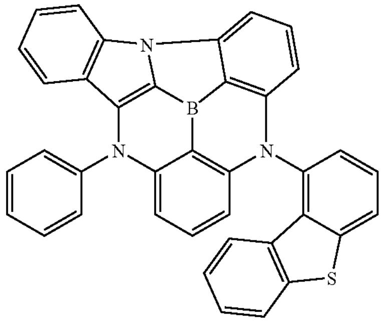
10
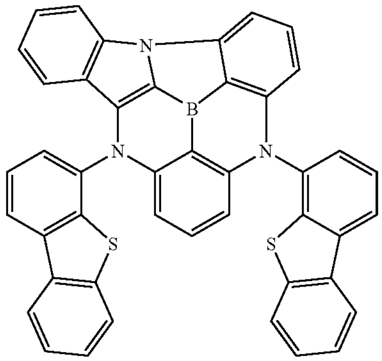
11
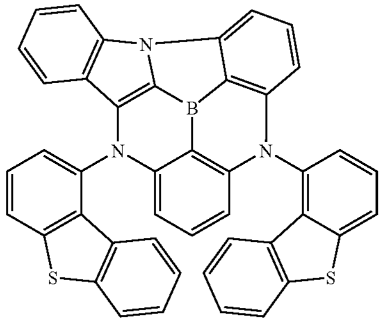
12
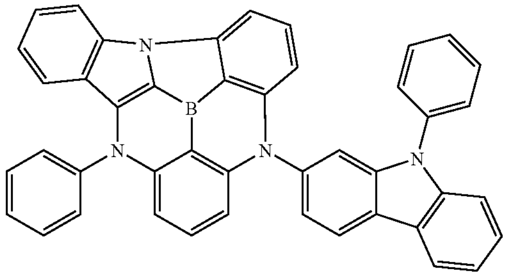
13
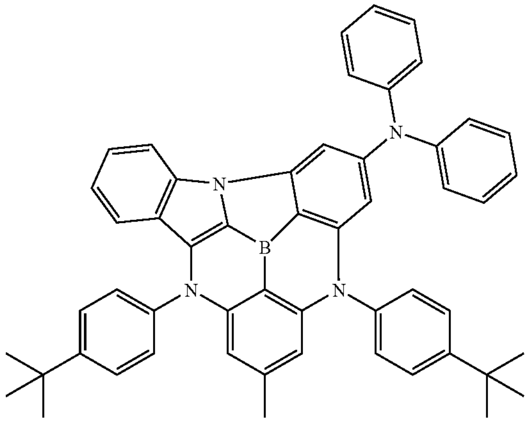
14
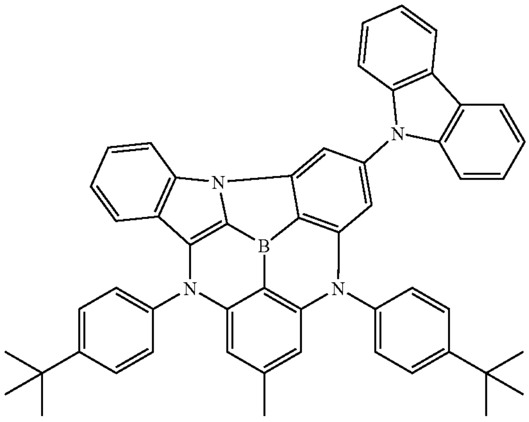
15
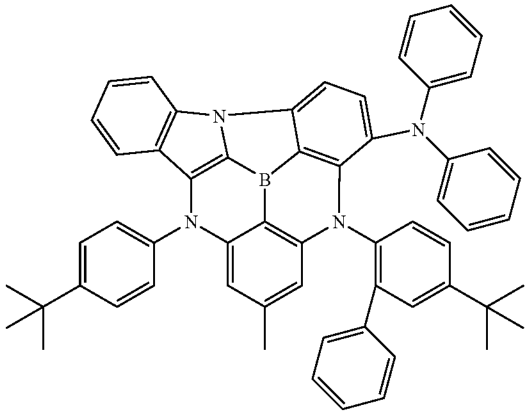

16
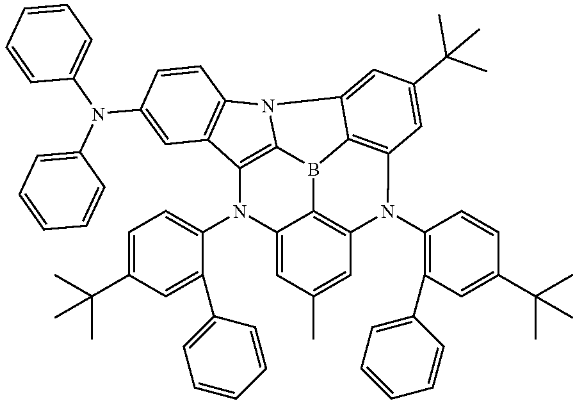
17
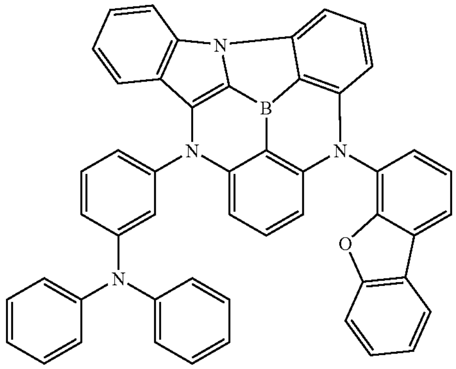
18
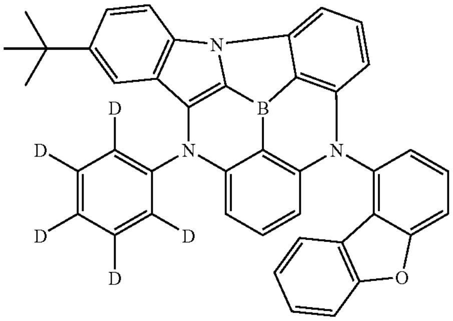
19
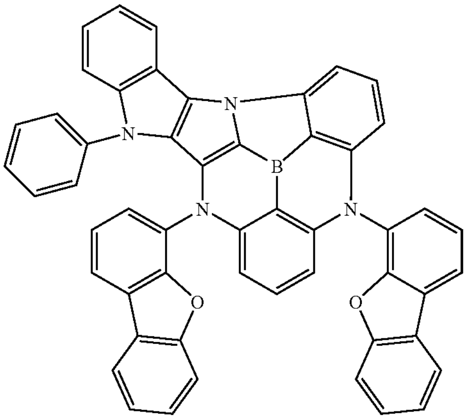
20
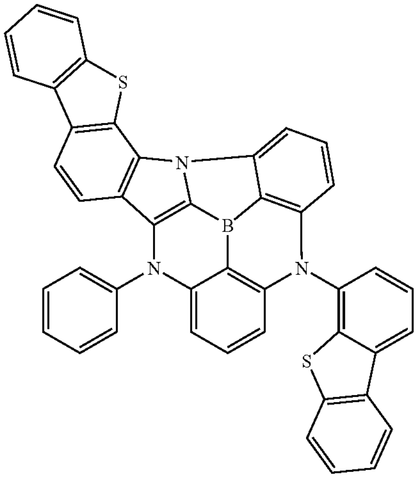
21
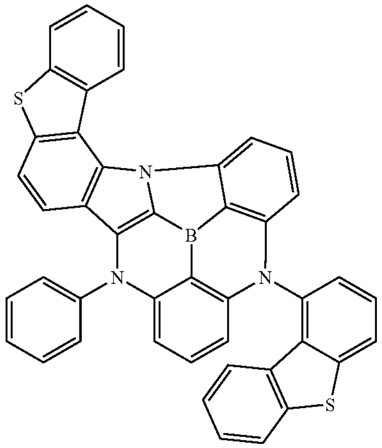
22
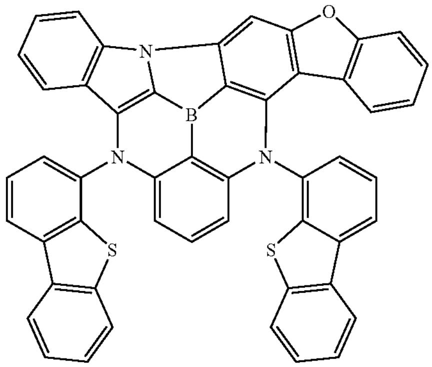

-continued
23
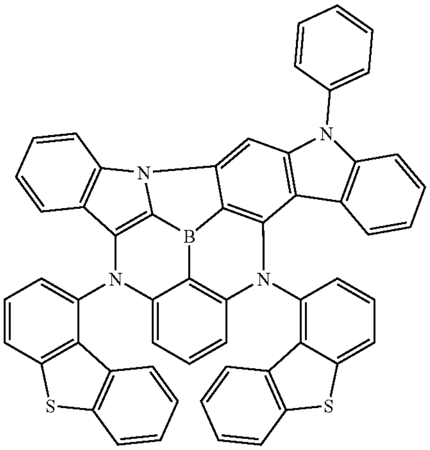
24
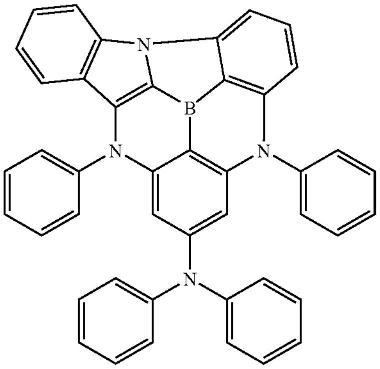
25
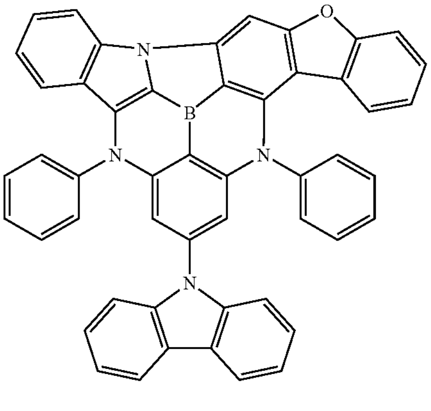
-continued
26
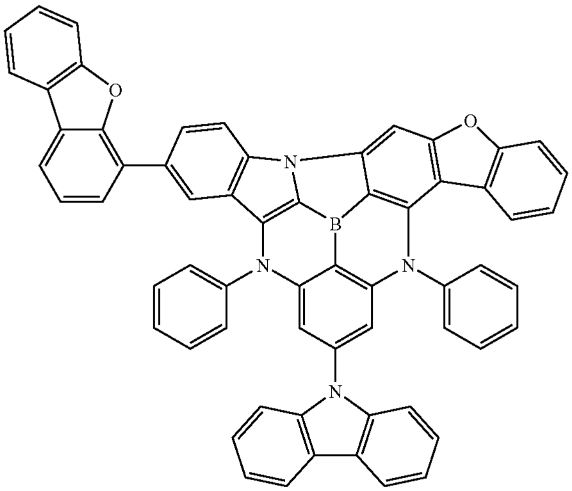
27
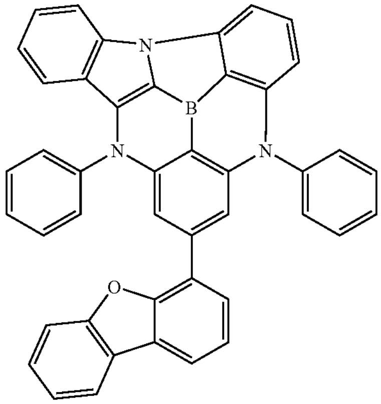
28
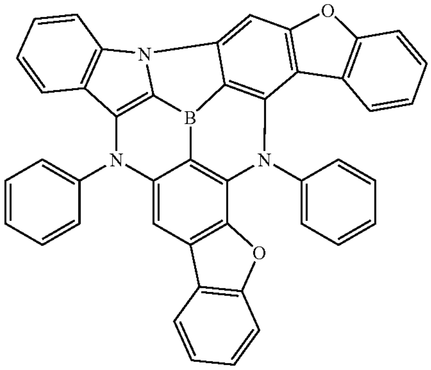
29
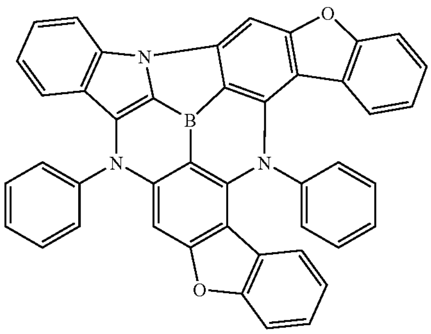

-continued
30
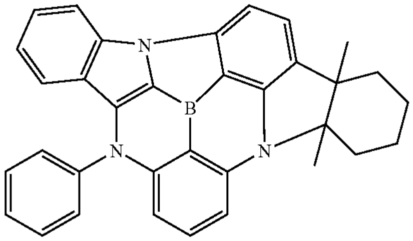
31
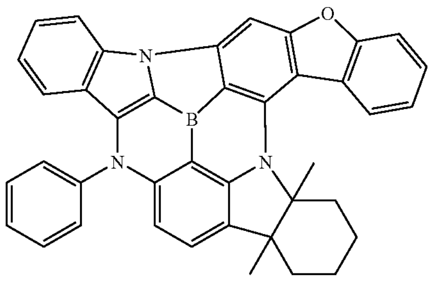
32
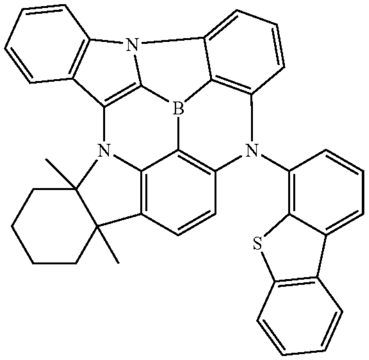
33
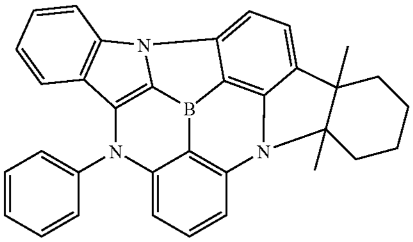
34
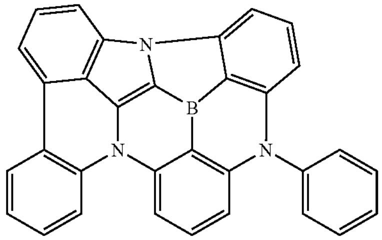
-continued
35
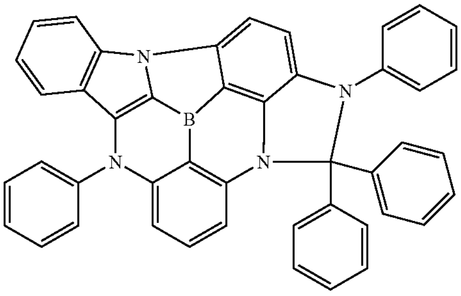
36
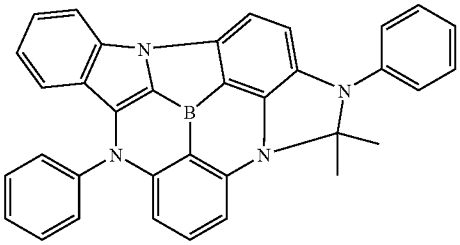
37
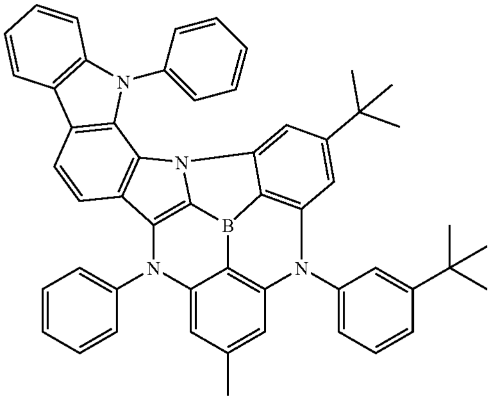
38
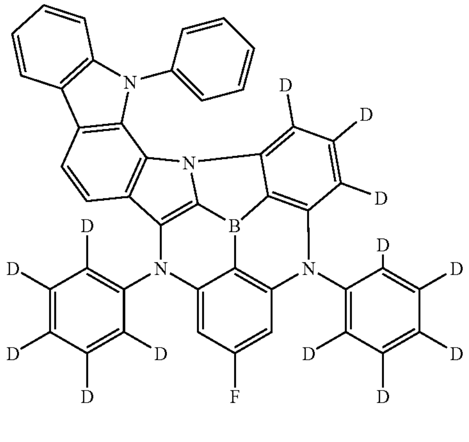

-continued
39
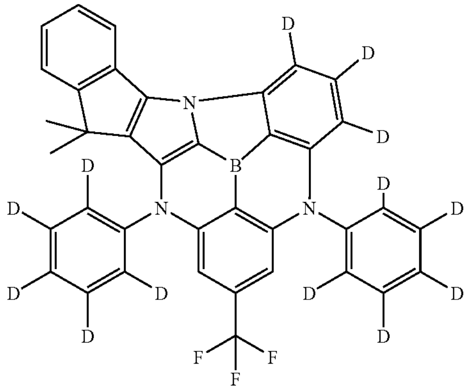
40
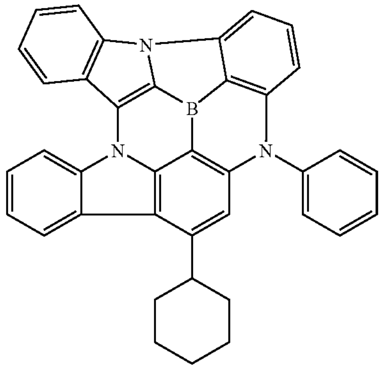
41
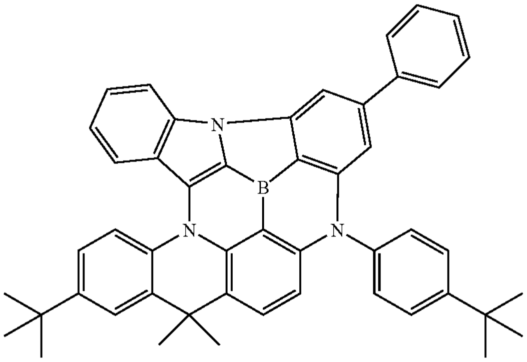
42
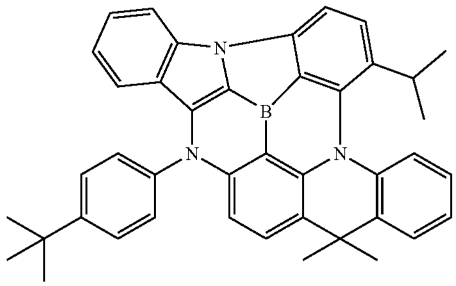
-continued
43
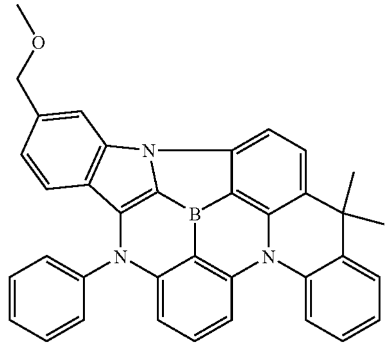
44
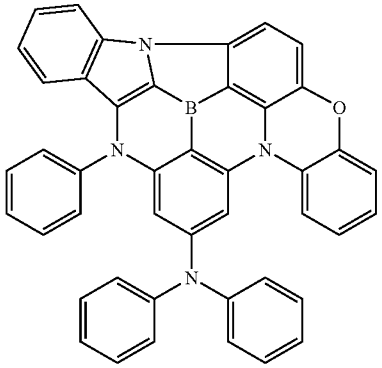
45
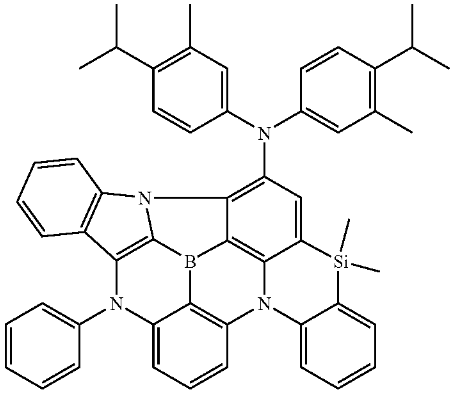
64
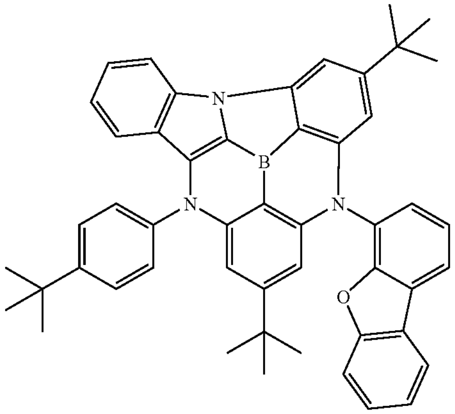

65
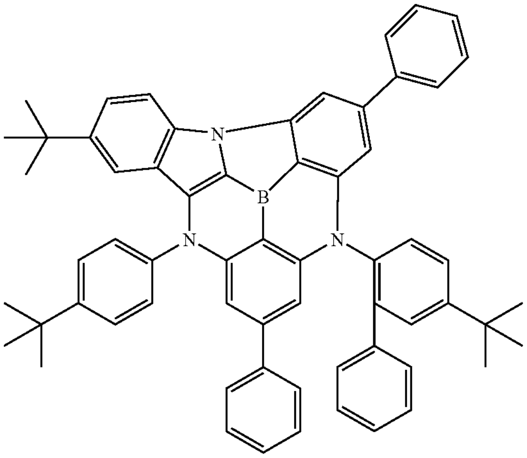
66
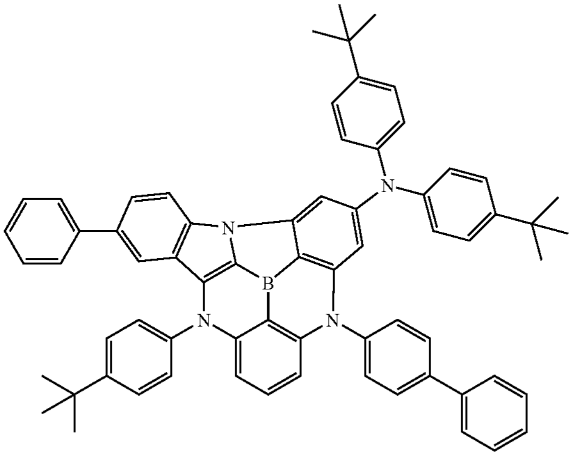
67
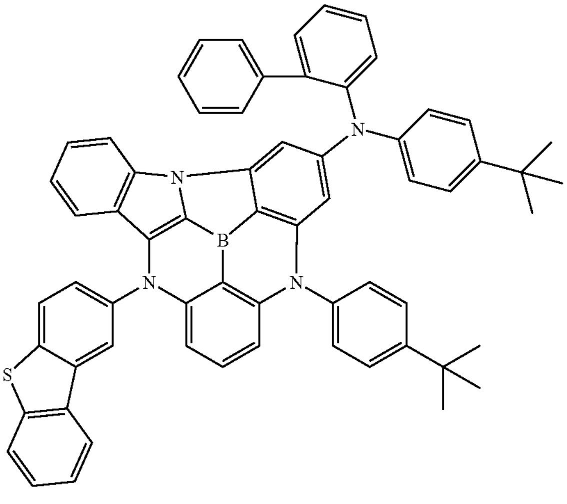
68
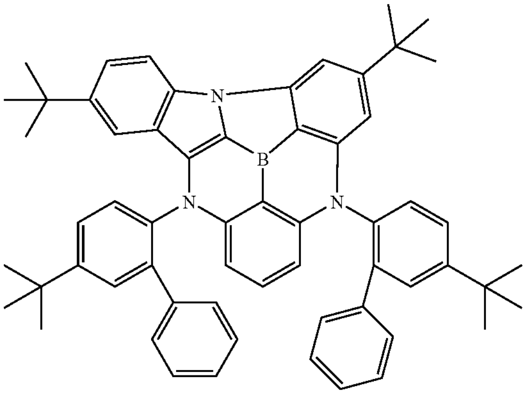
69
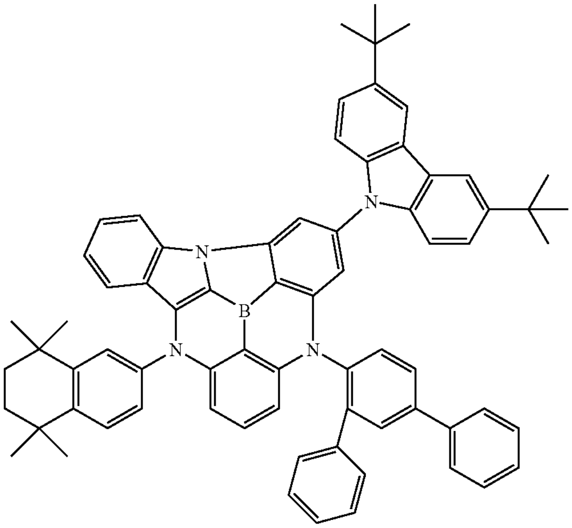
70
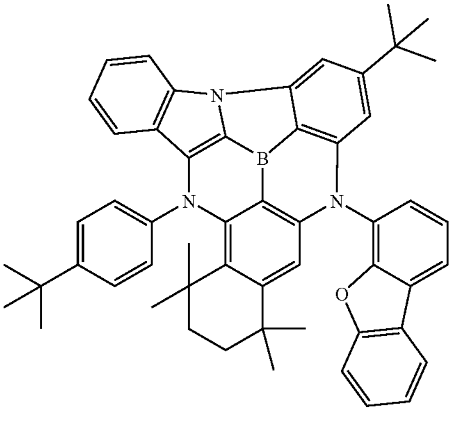

-continued

71

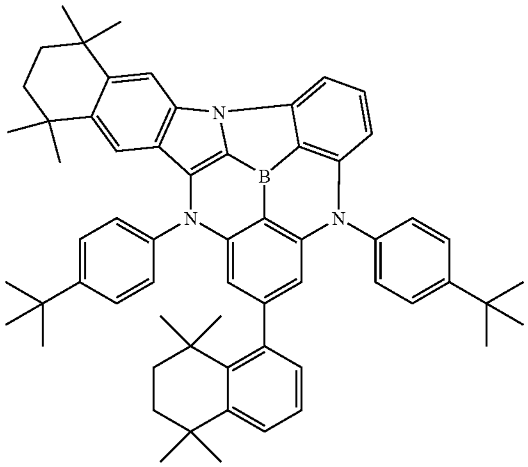

72

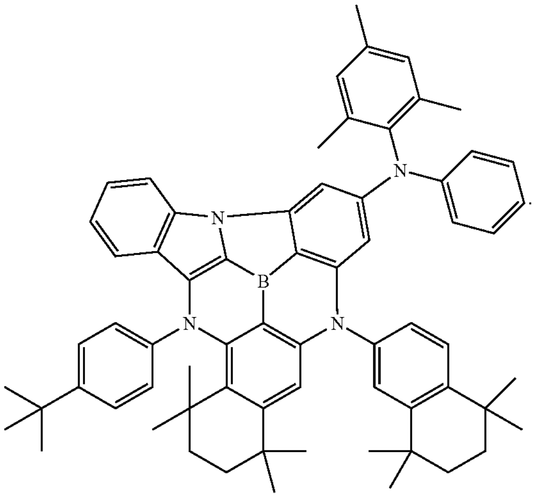

3. An organic electroluminescent device comprising a first electrode, a second electrode, and one or more organic layers interposed between the first and second electrodes wherein one of the organic layers comprises the organic compound represented by Formula A according to claim 1.

4. The organic electroluminescent device according to claim 3, wherein the organic layers comprise an electron injecting layer, an electron transport layer, a hole injecting layer, a hole transport layer, an electron blocking layer, a hole blocking layer, and/or a light emitting layer, at least one of which comprises the organic compound represented by Formula A.

5. The organic electroluminescent device according to claim 4, wherein the light emitting layer is composed of a host and the compound represented by Formula A as a dopant.

6. The organic electroluminescent device according to claim 5, wherein the host is an anthracene derivative represented by Formula C:

[Formula C]

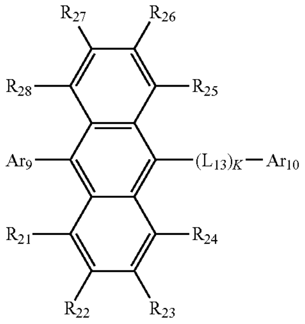

wherein $R_{21}$ to $R_{28}$ are identical to or different from each other and are each independently selected from hydrogen and deuterium, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted C2-C20 alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, halogen, substituted or unsubstituted amine, and substituted or unsubstituted silyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

7. The organic electroluminescent device according to claim 6, wherein $Ar_9$ in Formula C is a substituted or unsubstituted phenyl group or a substituted or unsubstituted naphthyl group.

8. The organic electroluminescent device according to claim 6, wherein the anthracene derivative represented by Formula C is selected from the compounds of Formulae C1 to C69:

C1

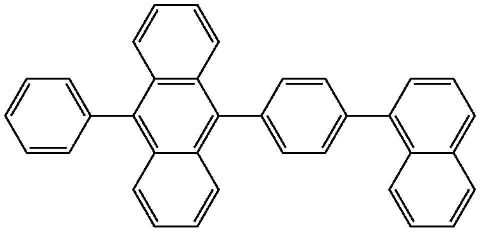

C2

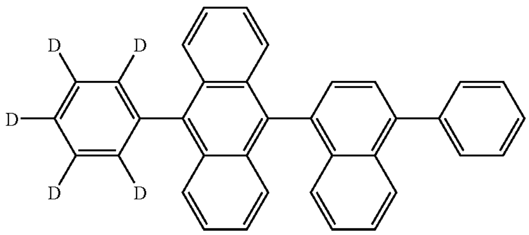

-continued
C3
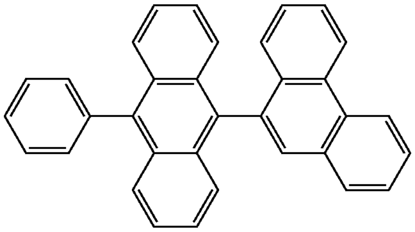
C4
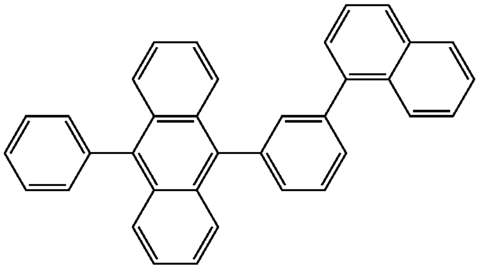
C5
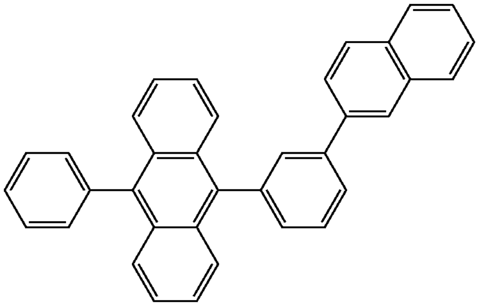
C6
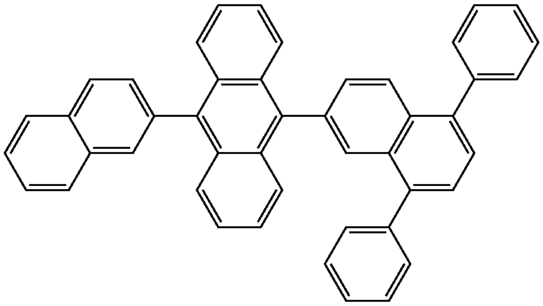
C7
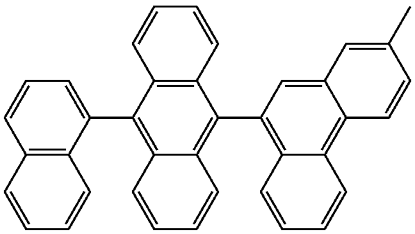
-continued
C8
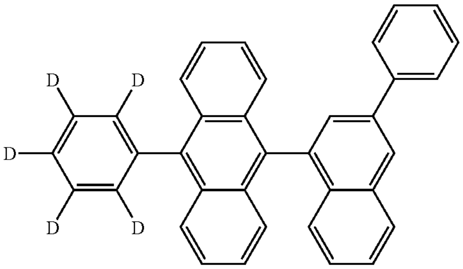
C9
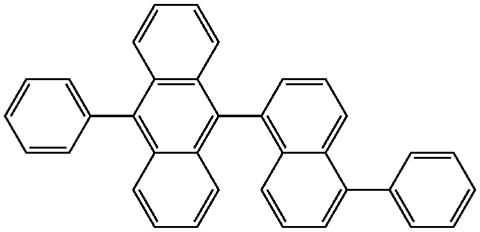
C10
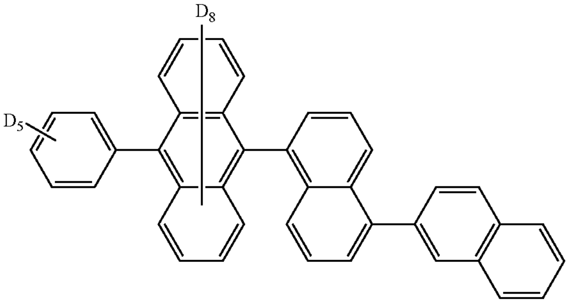
C11
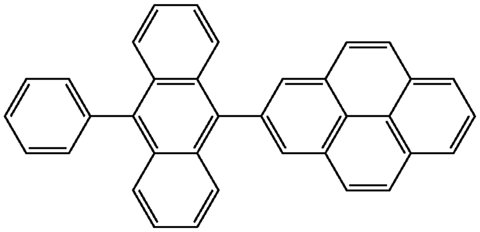
C12
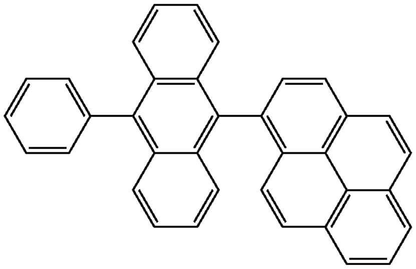
C13
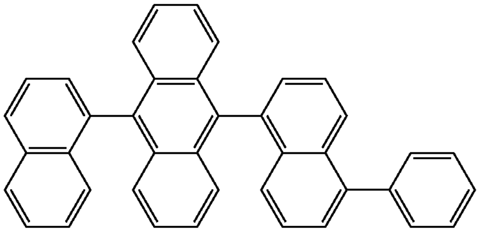

-continued
C14
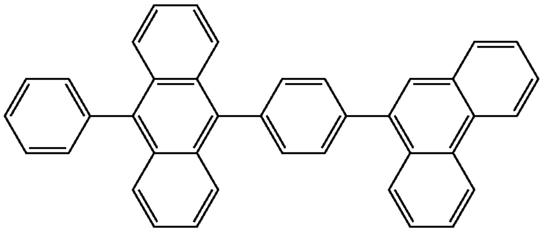
C15
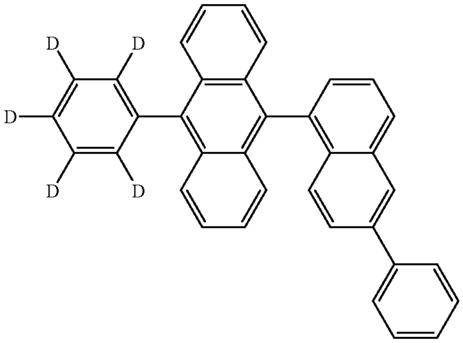
C16
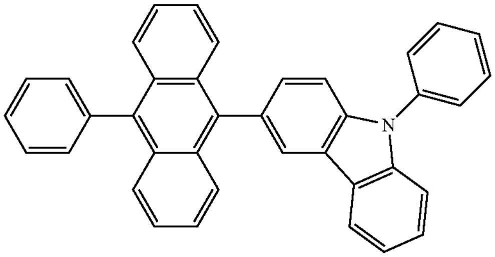
C17
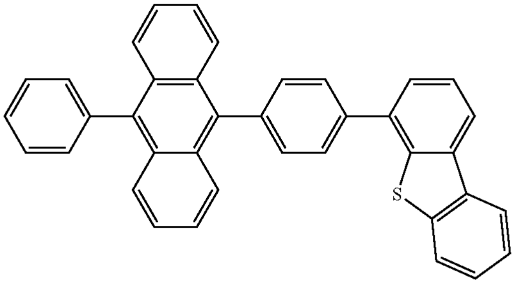
C18
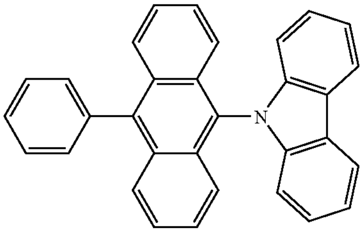
-continued
C19
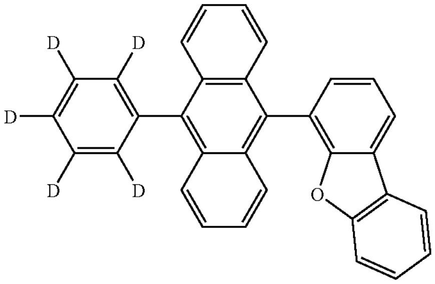
C20
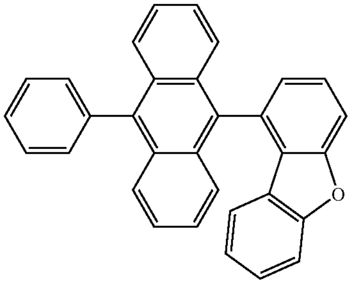
C21
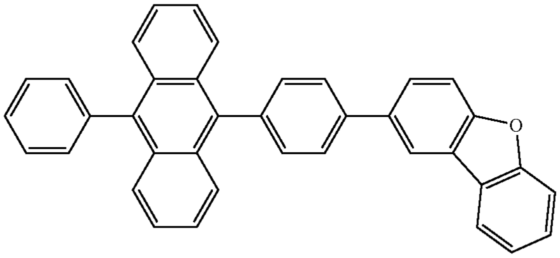
C22
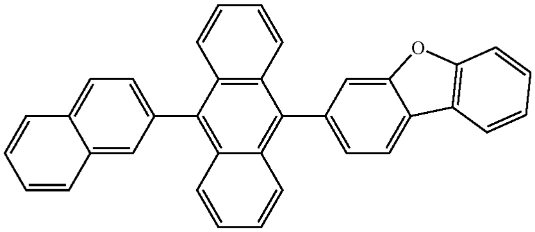
C23
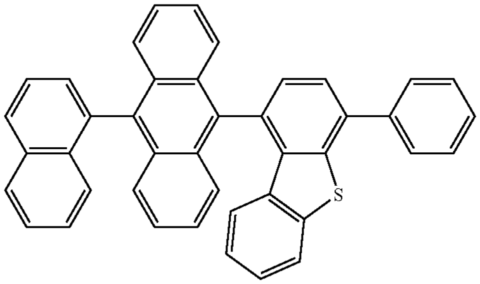

-continued
C24
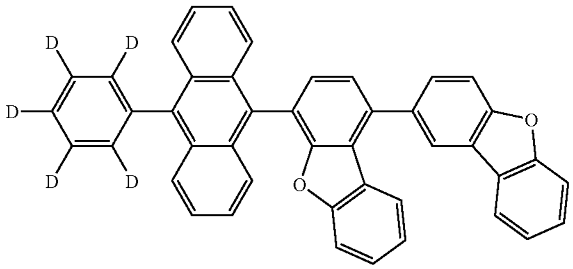
C25
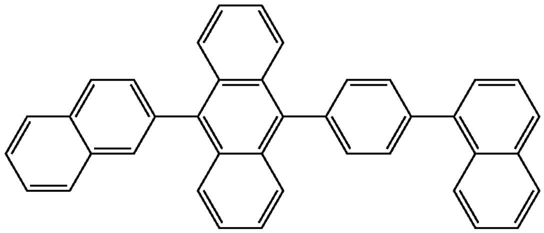
C26
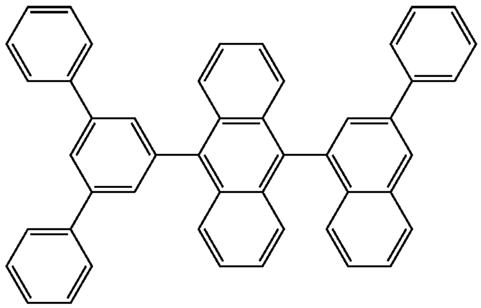
C27
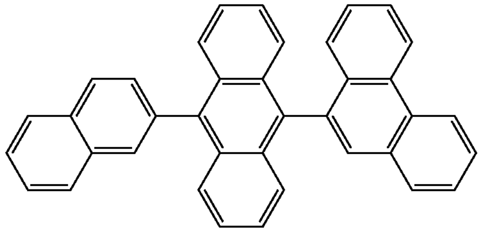
C28
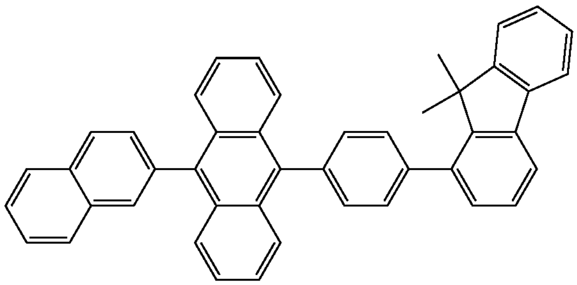
-continued
C29
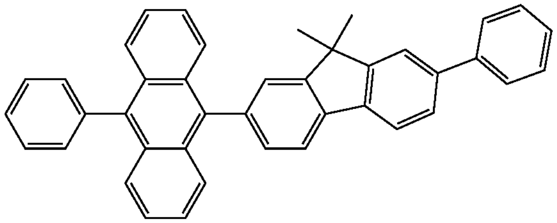
C30
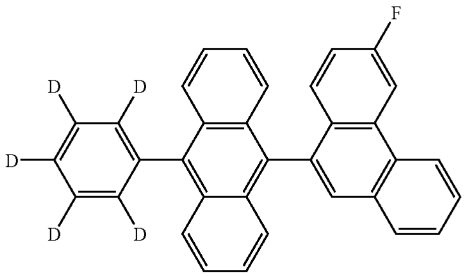
C31
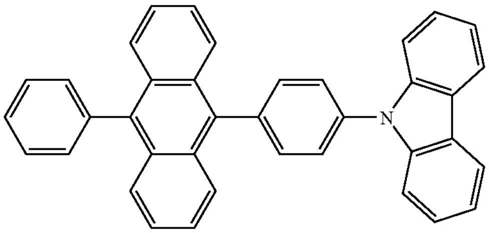
C32
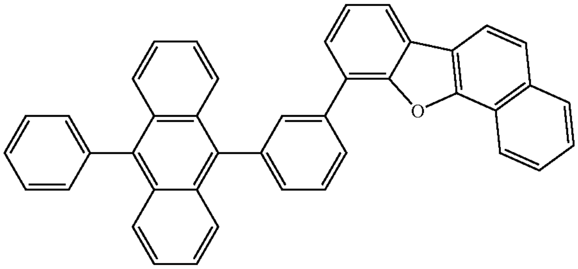
C33
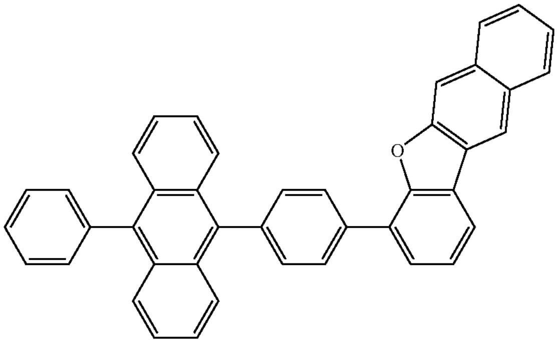

-continued
C34
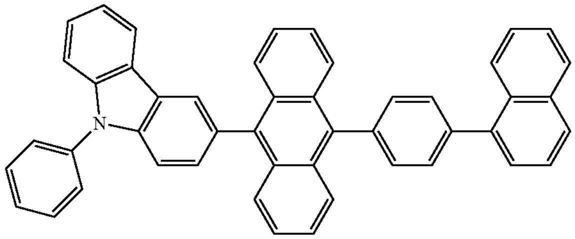
C35
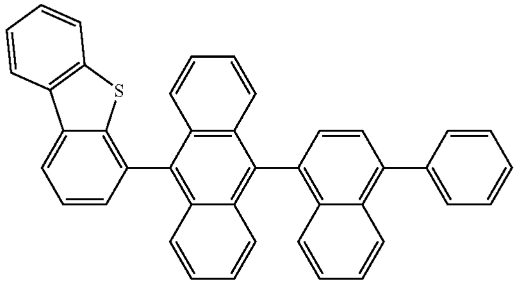
C36
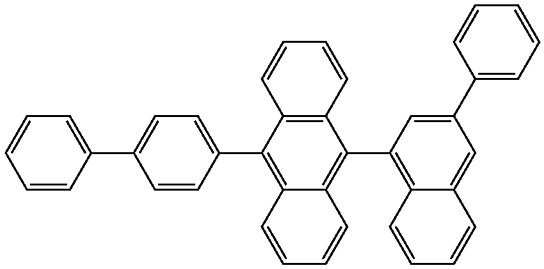
C37
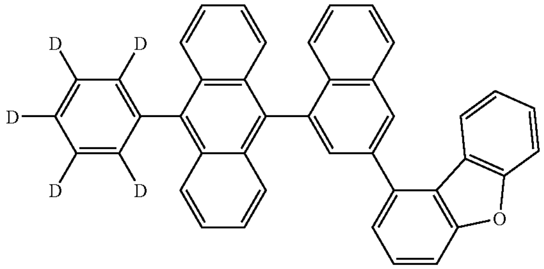
C38
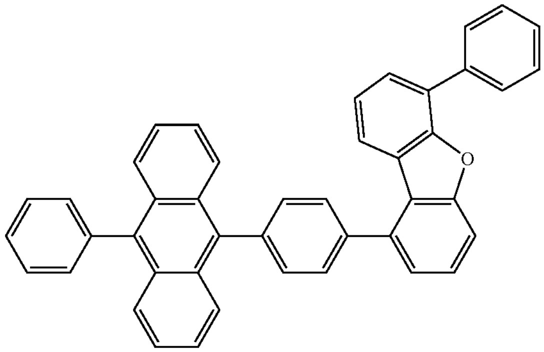
-continued
C39
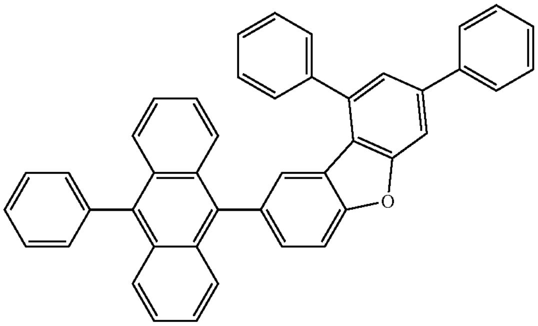
C40
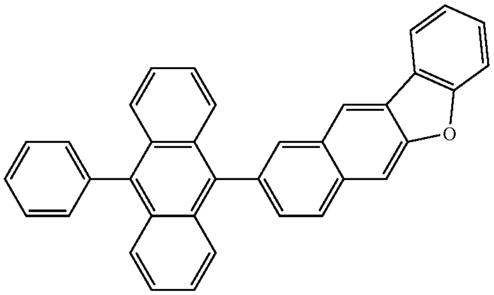
C41
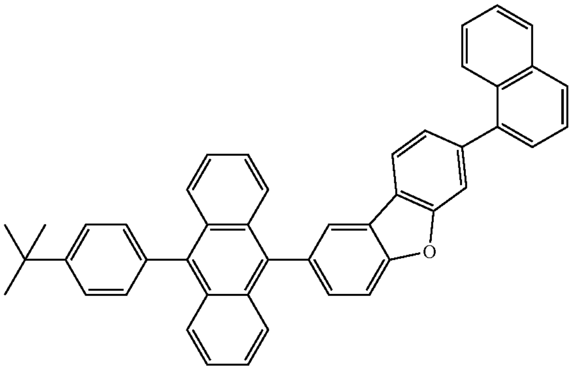
C42
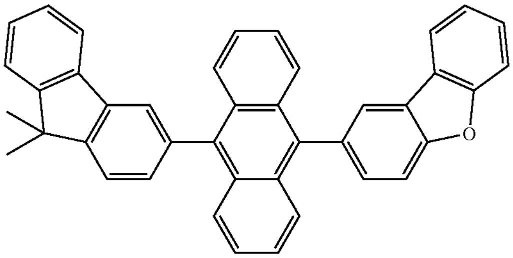

-continued
C43
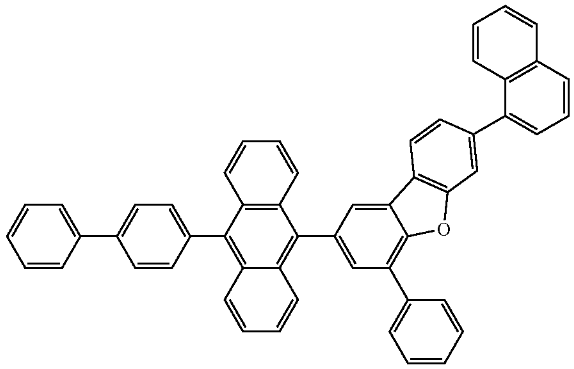
C44
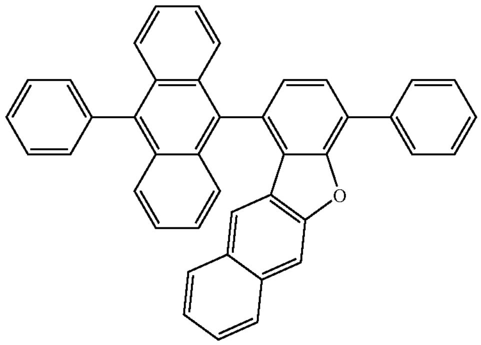
C45
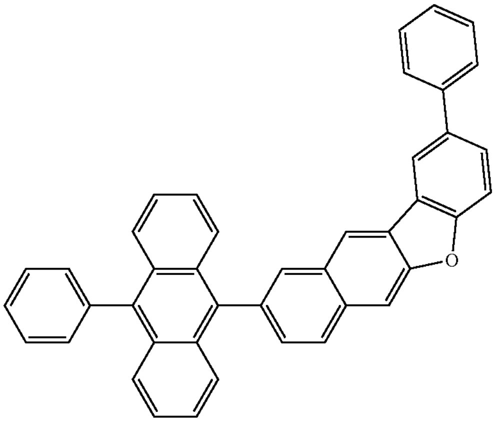
C46
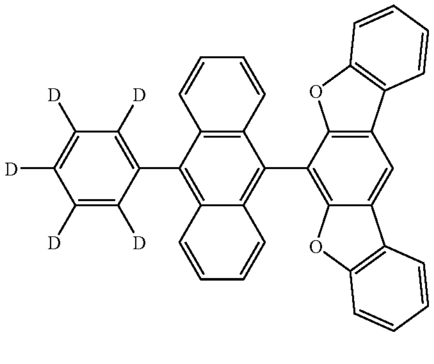
-continued
C47
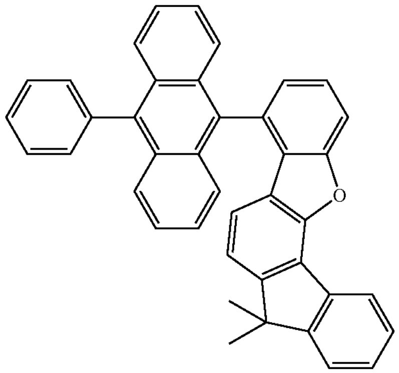
C48
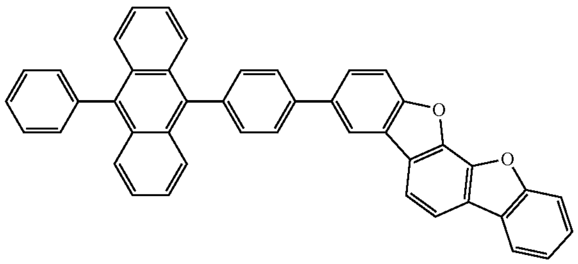
C49
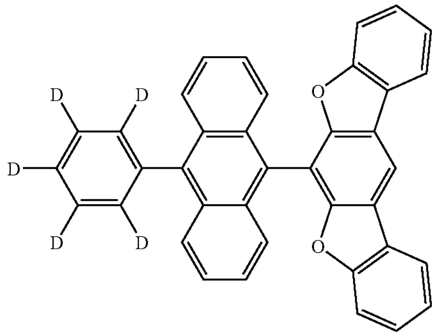
C50
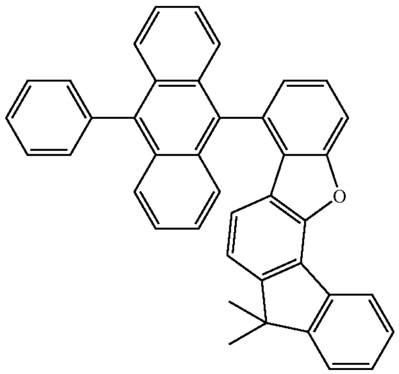

-continued
C51
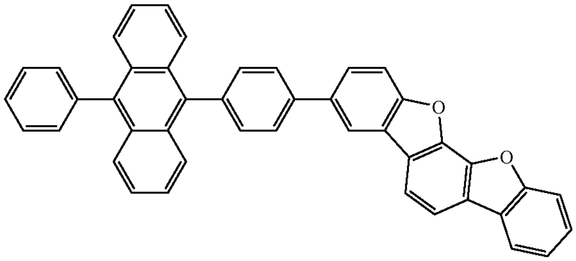
C52
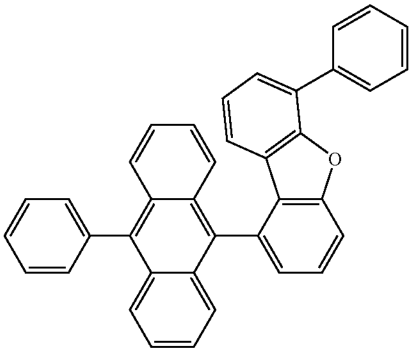
C53
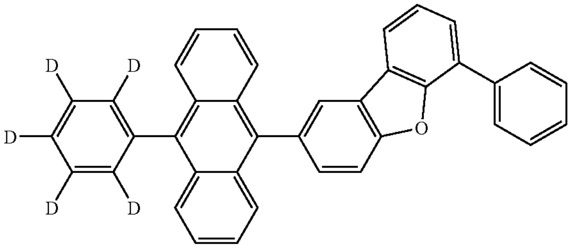
C54
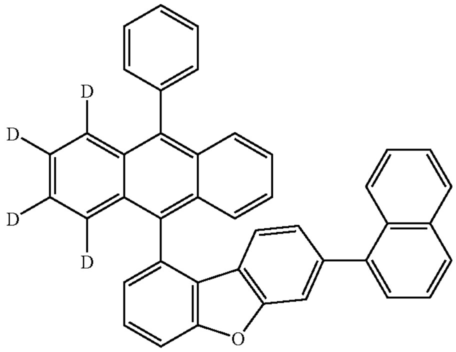
-continued
C55
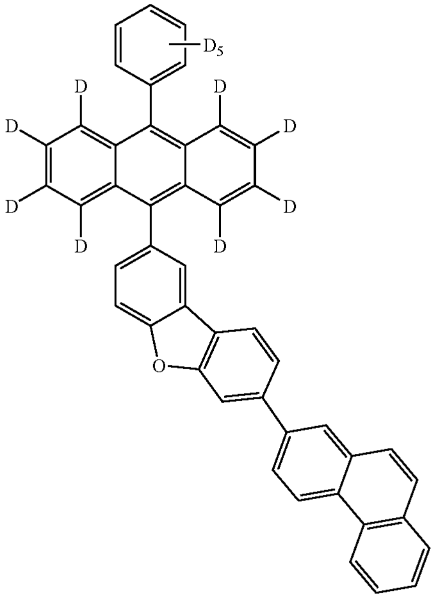
C56
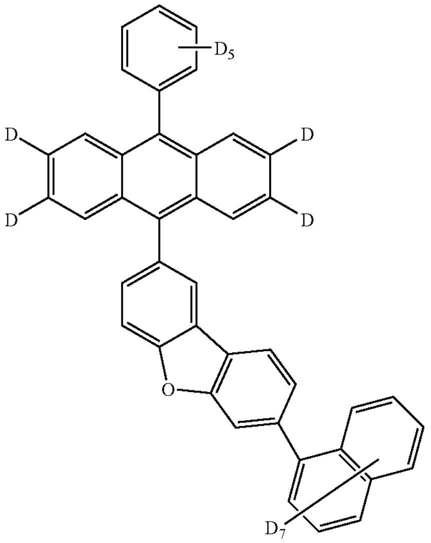
C57
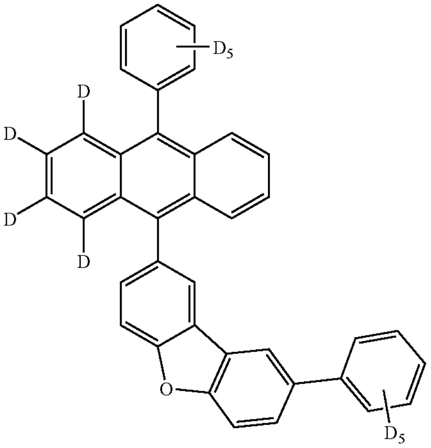

-continued
C58
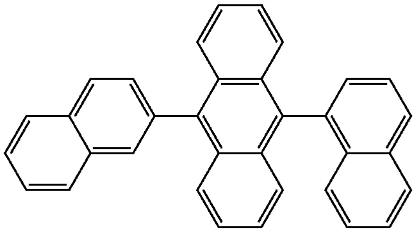
C59
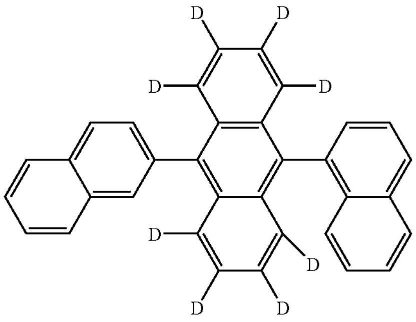
C60
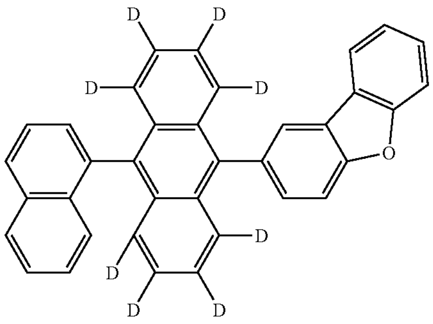
C61
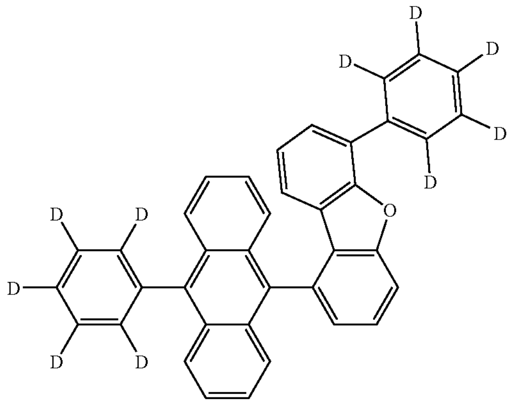
C62
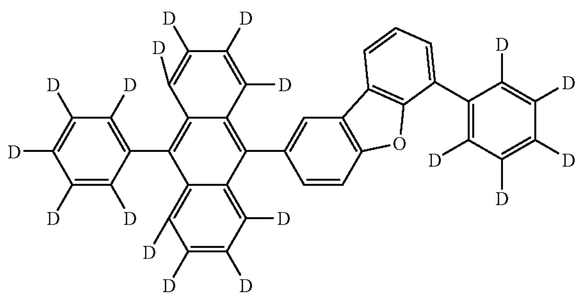
-continued
C63
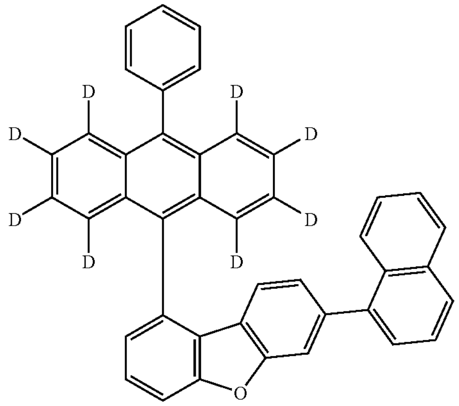
C64
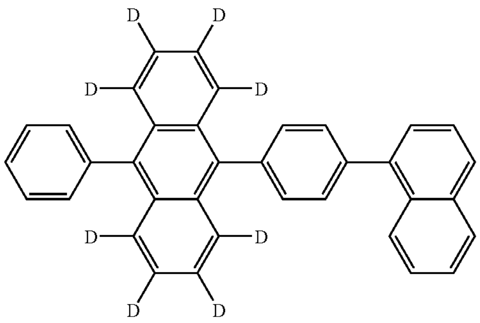
C65
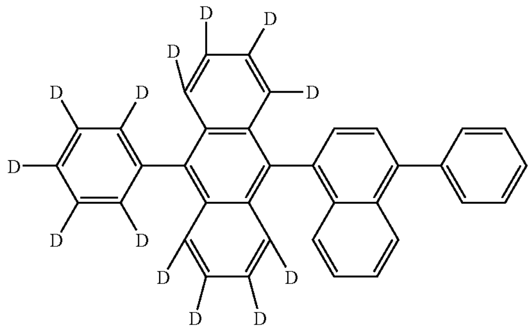
C66
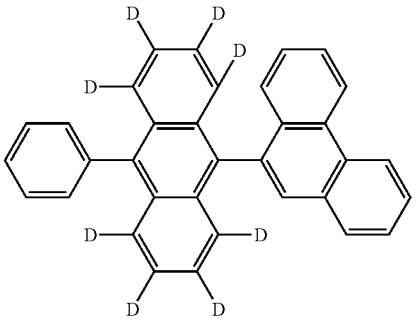

-continued

C67

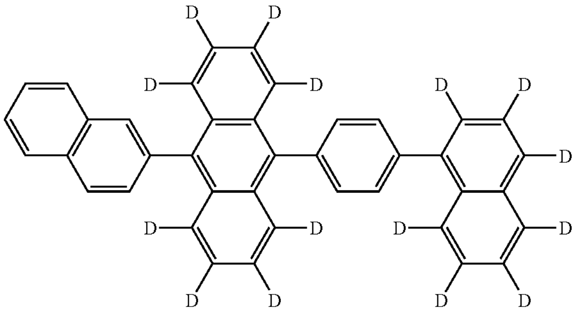

C68

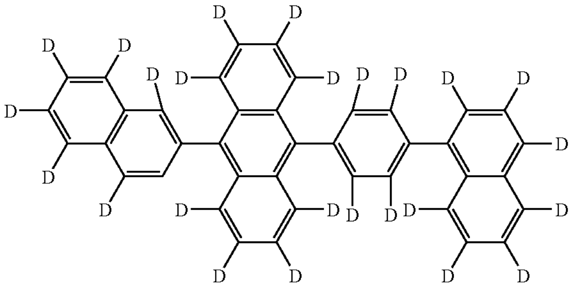

-continued

C69

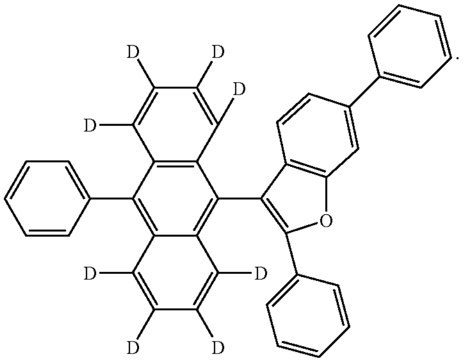

9. The organic electroluminescent device according to claim 4, wherein one or more of the layers are formed by a deposition or solution process.

10. The organic electroluminescent device according to claim 3, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *